United States Patent
Kasahara et al.

(10) Patent No.: US 11,041,755 B2
(45) Date of Patent: Jun. 22, 2021

(54) PRODUCTION METHOD FOR FABRY-PEROT INTERFERENCE FILTER

(71) Applicant: HAMAMATSU PHOTONICS K.K., Hamamatsu (JP)

(72) Inventors: Takashi Kasahara, Hamamatsu (JP); Katsumi Shibayama, Hamamatsu (JP); Masaki Hirose, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 130 days.

(21) Appl. No.: 16/303,688

(22) PCT Filed: May 26, 2017

(86) PCT No.: PCT/JP2017/019680
§ 371 (c)(1),
(2) Date: Nov. 21, 2018

(87) PCT Pub. No.: WO2017/204326
PCT Pub. Date: Nov. 30, 2017

(65) Prior Publication Data
US 2020/0141801 A1 May 7, 2020

(30) Foreign Application Priority Data

May 27, 2016 (JP) .............................. JP2016-106269
Aug. 24, 2016 (JP) ................................. 2016-163916
Aug. 24, 2016 (JP) ................................. 2016-163942

(51) Int. Cl.
*G01J 3/26* (2006.01)
*B23K 26/53* (2014.01)
(Continued)

(52) U.S. Cl.
CPC ................ *G01J 3/26* (2013.01); *B23K 26/08* (2013.01); *B23K 26/53* (2015.10); *G02B 5/28* (2013.01); *G02B 26/001* (2013.01)

(58) Field of Classification Search
CPC .......... G01J 3/26; G02B 26/001; G02B 5/28; B23K 26/53; B23K 26/08
(Continued)

(56) References Cited

U.S. PATENT DOCUMENTS 6,436,794 B1  8/2002  Lee et al.
7,063,466 B2  6/2006  Ferguson
(Continued)

FOREIGN PATENT DOCUMENTS

CN  1059968 A  4/1992
CN  1085343 C  5/2002
(Continued)

OTHER PUBLICATIONS

International Preliminary Report on Patentability dated Dec. 6, 2018 for PCT/JP2017/019680.
(Continued)

*Primary Examiner* — Binh X Tran
(74) *Attorney, Agent, or Firm* — Faegre Drinker Biddle & Reath LLP

(57) ABSTRACT

A method of manufacturing a Fabry-Perot interference filter includes a forming step of forming a first mirror layer having a plurality of first mirror portions, a sacrificial layer having a plurality of portions expected to be removed, and a second mirror layer having a plurality of second mirror portions on a first main surface of a wafer which includes parts corresponding to a plurality of two-dimensionally arranged substrates and is expected to be cut into the plurality of substrates along each of a plurality of lines; a removing step of simultaneously removing the plurality of two-dimension- (Continued)

ally arranged portions expected to be removed from the sacrificial layer through etching after the Ruining step; and a cutting step of cutting the wafer into the plurality of substrates along each of the plurality of lines after the removing step.

12 Claims, 16 Drawing Sheets

(51) Int. Cl.
  *B23K 26/08* (2014.01)
  *G02B 5/28* (2006.01)
  *G02B 26/00* (2006.01)

(58) Field of Classification Search
  USPC .................................................. 216/65, 94
  See application file for complete search history.

(56) References Cited

U.S. PATENT DOCUMENTS

| | | | |
|---|---|---|---|
| 7,420,728 B2 | 9/2008 | Tung et al. | |
| 7,830,586 B2 | 11/2010 | Miles | |
| 9,261,753 B2 | 2/2016 | Guo et al. | |
| 2003/0002809 A1* | 1/2003 | Jian | G02B 6/423 385/73 |
| 2003/0116711 A1 | 6/2003 | Hara et al. | |
| 2006/0110851 A1 | 5/2006 | Burrell et al. | |
| 2007/0041076 A1 | 2/2007 | Zhong et al. | |
| 2007/0057999 A1 | 3/2007 | Kuroda | |
| 2007/0202628 A1 | 8/2007 | Wuertz | |
| 2009/0109423 A1 | 4/2009 | Carr | |
| 2010/0015782 A1 | 1/2010 | Yu et al. | |
| 2011/0279824 A1 | 11/2011 | Blomberg et al. | |
| 2012/0050751 A1 | 3/2012 | Blomberg | |
| 2012/0287138 A1 | 11/2012 | Zhong et al. | |
| 2013/0059428 A1 | 3/2013 | Arai | |
| 2013/0329232 A1 | 12/2013 | Antila et al. | |
| 2014/0099777 A1* | 4/2014 | Mackh | H01L 21/6836 438/463 |
| 2014/0111811 A1 | 4/2014 | Tuohiniemi | |
| 2015/0138642 A1 | 5/2015 | Banerjee et al. | |
| 2015/0311664 A1 | 10/2015 | Bulovic et al. | |
| 2016/0370573 A1 | 12/2016 | Shibayama et al. | |

FOREIGN PATENT DOCUMENTS

| | | | |
|---|---|---|---|
| CN | 1758986 A | 4/2006 | |
| CN | 1849699 A | 10/2006 | |
| CN | 1983557 A | 6/2007 | |
| CN | 102375229 A | 3/2012 | |
| CN | 103026468 A | 4/2013 | |
| CN | 102449447 B | 6/2014 | |
| CN | 105339829 A | 2/2016 | |
| EP | 3018521 A1 | 5/2016 | |
| EP | 3467565 A1 | 4/2019 | |
| EP | 3467567 A1 | 4/2019 | |
| EP | 3505987 A1 | 7/2019 | |
| EP | 3505988 A1 | 7/2019 | |
| JP | 2002-174721 A | 6/2002 | |
| JP | 2007-036233 A | 2/2007 | |
| JP | 2007-038394 A | 2/2007 | |
| JP | 2007-077864 A | 3/2007 | |
| JP | 2008-103776 A | 5/2008 | |
| JP | 2009-505162 A | 2/2009 | |
| JP | 2009-081428 A | 4/2009 | |
| JP | 2009-147108 A | 7/2009 | |
| JP | 2011-027923 A | 2/2011 | |
| JP | 2011-087272 A | 4/2011 | |
| JP | 2011-181909 A | 9/2011 | |
| JP | 2012-528345 A | 11/2012 | |
| JP | 2013-506154 A | 2/2013 | |
| JP | 2013-257561 A | 12/2013 | |
| JP | 2015-011311 A | 1/2015 | |
| JP | 2015-011312 A | 1/2015 | |
| JP | 2015-521401 A | 7/2015 | |
| JP | 2015-152713 A | 8/2015 | |
| JP | 2015-199071 A | 11/2015 | |
| JP | 2016-099583 A | 5/2016 | |
| KR | 10-2013-0093547 A | 8/2013 | |
| WO | WO-2007/022476 A1 | 2/2007 | |
| WO | WO 2007/107176 A1 | 9/2007 | |
| WO | WO-2010/075012 A2 | 7/2010 | |
| WO | WO 2010/086502 A1 | 8/2010 | |
| WO | WO 2010/136654 A1 | 12/2010 | |
| WO | WO-2011/036346 A1 | 3/2011 | |
| WO | WO-2013/158995 A1 | 10/2013 | |
| WO | WO-2015002028 A1 * | 1/2015 | ............... G01J 3/26 |
| WO | WO 2015/122316 A1 | 8/2015 | |
| WO | WO 2015/195123 A1 | 12/2015 | |

OTHER PUBLICATIONS

International Preliminary Report on Patentability dated Dec. 6, 2018 for PCT/JP2017/017172.
International Preliminary Report on Patentability dated Dec. 6, 2018 for PCT/JP2017/017167.
International Preliminary Report on Patentability (IPRP) dated Mar. 7, 2019 that issued in WO Patent Application No. PCT/JP2017/024645.
A. Rissanen et al., "Tunable MOEMS Fabry-Perot interferometer for miniaturized spectral sensing in near-infrared", Proceedings of SPIE/ IS & T, vol. 8977, Mar. 7, 2014, p. 89770X, XP060034717.
S. Sullivan et al., "Non-Traditional Dicing of MEMS Devices", NSTI-Nanotech 2008, Jan. 1, 2008, XP055144278.
A. Hooper et al., "Review of wafer dicing techniques for via-middle process 3DI/TSV ultrathin silicon device wafers", 2015 IEEE 65th Electronic Components and Technology Conference (ECTC), IEEE, May 26, 2015, p. 1436-p. 1446, XP033175240.
Magna Antonino LA et al., "Factors Affecting Profile Evolution in Plasma Etching of SiO2", Journal of the Electrochemical Society, vol. 150, No. 10, Jan. 1, 2003, p. F178, XP055791842.
Roxhed N. et al., "Tapered deep reactive ion etching: Method and characterization", Transducers 2007: International Solid-State Sensors, Actuators and Microsystems Conference, 2007: Jun. 10-14, 2007, Lyon, France, Jun. 10, 2007, p. 493-p. 496, XP002591592.
Anonymous, "Trapezoid—Wikipedia", Retrieved from the Internet: URL:https://en.wikipedia.org/w/index.php?title=Trapezoid&oldid=732053688[retrieved on Mar. 31, 2021], Jul. 29, 2016, XP055791892.
Anonymous, "Saccheri quadrilateral—Wikipedia", Retrieved from the Internet: URL: https://en.wikipedia.org/w/index.php?title=Saccheri_quadrilateral&oldid=720273849[retrieved on Mar. 31, 2021], May 14, 2016, XP055791891.

* cited by examiner

Fig.5
(a)
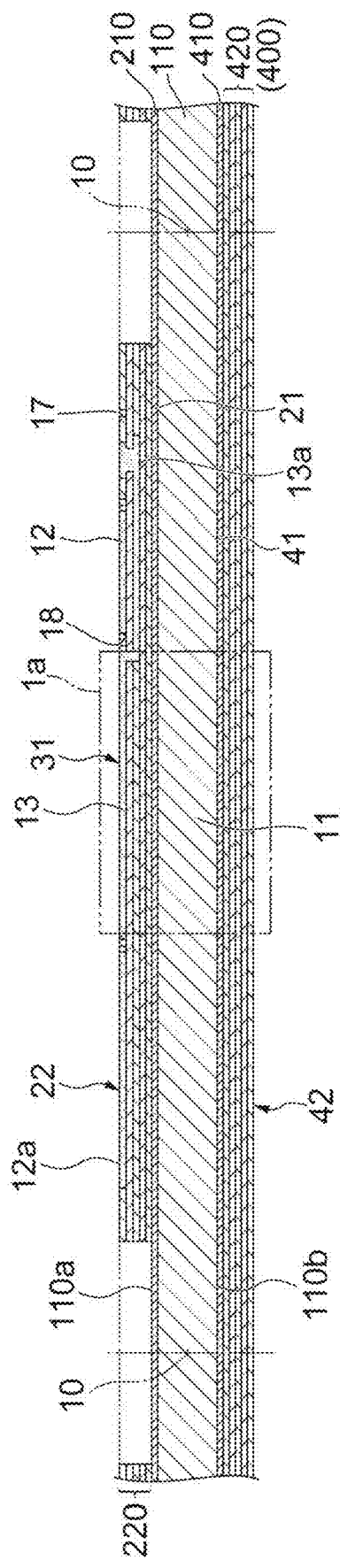
(b)
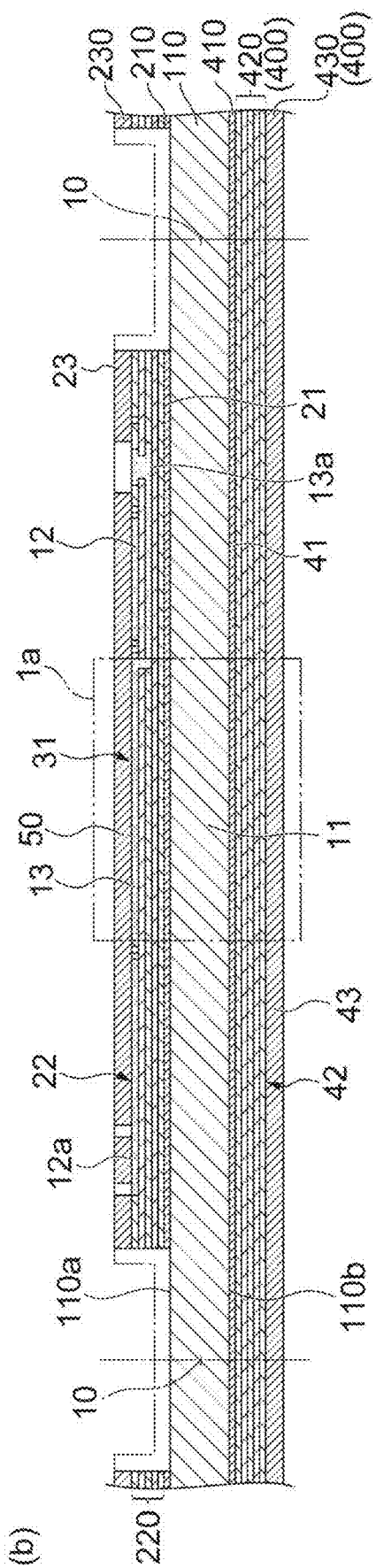

Fig.6
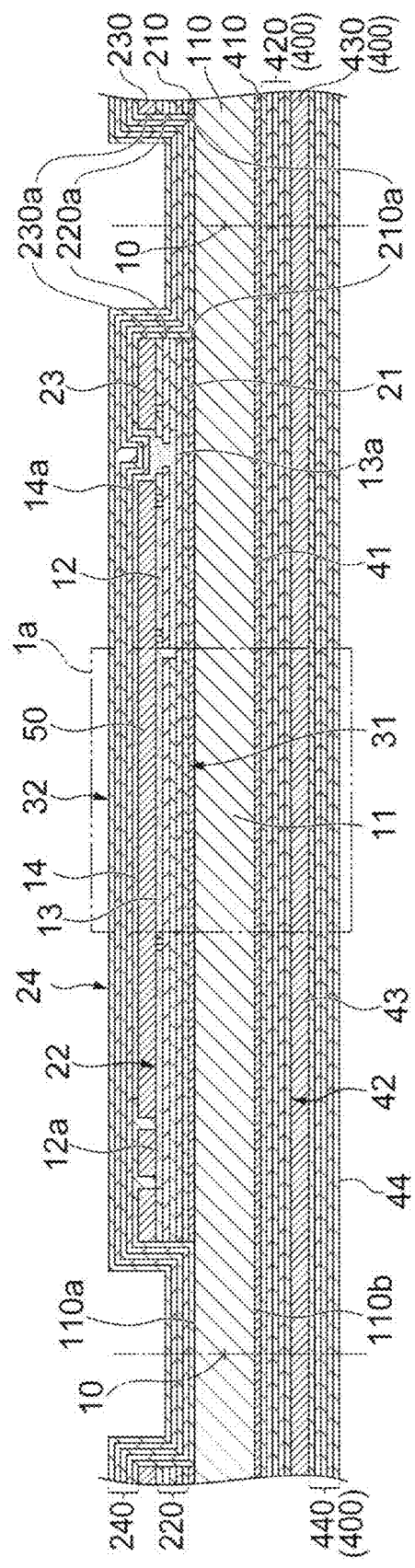
(a)
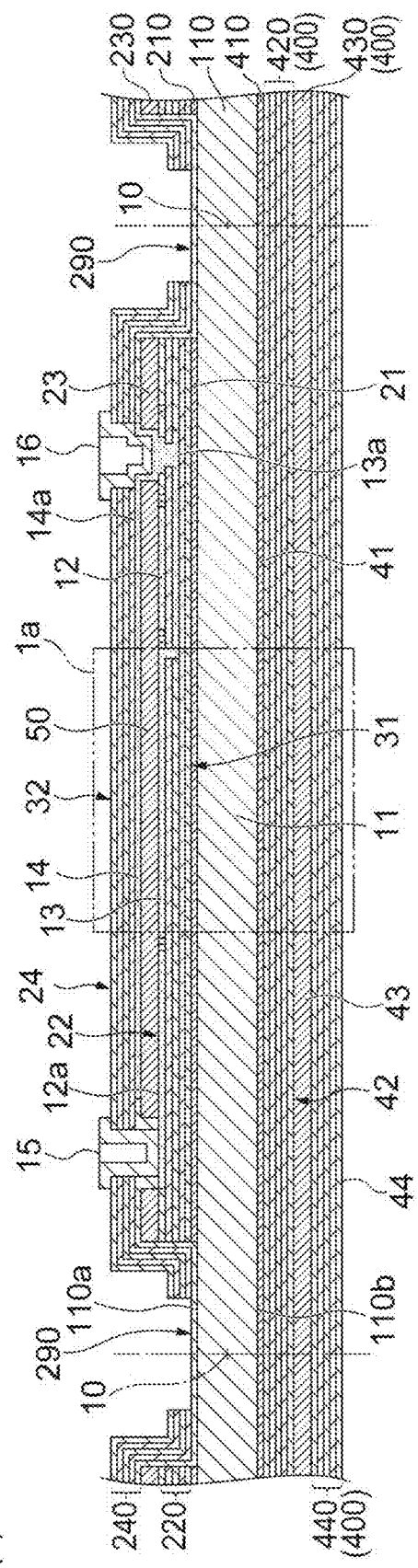
(b)

PRODUCTION METHOD FOR FABRY-PEROT INTERFERENCE FILTER

TECHNICAL FIELD

The present disclosure relates to a method of manufacturing a Fabry-Perot interference filter.

BACKGROUND ART

In the related art, a Fabry-Perot interference filter, which includes a substrate, a fixed mirror and a movable mirror facing each other via a gap on the substrate, and an intermediate layer defining the gap, is known (for example, refer to Patent Literature 1).

CITATION LIST

Patent Literature

Patent Literature 1: Japanese Unexamined Patent Publication No. 2013-506154

SUMMARY OF INVENTION

Technical Problem

Since a Fabry-Perot interference filter as described above is a fine structure, it is difficult to improve both manufacturing efficiency and a yield when a Fabry-Perot interference filter is manufactured.

Accordingly, an object of the present disclosure is to provide a method of manufacturing a Fabry-Perot interference filter, in which both manufacturing efficiency and a yield can be improved.

Solution to Problem

According to an aspect of the present disclosure, there is provided a method of manufacturing a Fabry-Perot interference filter including a forming step of forming a first mirror layer having a plurality of first mirror portions each of which is expected to function as a fixed mirror, a sacrificial layer having a plurality of portions expected to be removed, and a second mirror layer having a plurality of second mirror portions each of which is expected to function as a movable mirror, on a first main surface of a wafer which includes parts corresponding to a plurality of two-dimensionally arranged substrates and is expected to be cut into the plurality of substrates along each of a plurality of lines, such that one first mirror portion, one portion expected to be removed, and one second mirror portion are disposed in this order from one substrate side; a removing step of simultaneously removing the plurality of two-dimensionally arranged portions expected to be removed from the sacrificial layer through etching after the forming step; and a cutting step of cutting the wafer into the plurality of substrates along each of the plurality of lines after the removing step.

In the method of manufacturing a Fabry-Perot interference filter, the removing step of removing the plurality of portions expected to be removed from the sacrificial layer through etching is carried out at a wafer level. Accordingly, compared to a case in which the removing step is individually carried out at a chip level, it is possible to form a gap between the first mirror portion and the second mirror portion in a significantly efficient way. Further more, since a process proceeds simultaneously in a part corresponding to an arbitrary substrate within the wafer and parts corresponding to the surrounding substrates around the substrate, for example, since etching of the sacrificial layer is simultaneously carried out with respect to the plurality of two-dimensionally arranged portions expected to be removed, a bias of in-plane stress in the wafer can be reduced. Thus, according to the method of manufacturing a Fabry-Perot interference filter, both manufacturing efficiency and a yield can be improved.

According to the aspect of the present disclosure, in the method of manufacturing a Fabry-Perot interference filter, in the forming step, a first thinned region, in which at least one of the first mirror layer, the sacrificial layer, and the second mirror layer is partially thinned along each of the plurality of lines, may be formed. In the cutting step of cutting a wafer into a plurality of substrates along each of lines, although parts respectively corresponding to the second mirror portions in the second mirror layer are in a state of being raised in the gap, the first thinned region thinned along each of the lines is formed in advance. Therefore, compared to a case in which the first thinned region is not formed, an external force is unlikely to act on a structure around the gap. As a result, it is possible to effectively prevent a situation in which the structure around the gap is damaged. The "first thinned region" includes a region from which all of the parts along each of the lines in the first mirror layer, the sacrificial layer, and the second mirror layer are removed.

According to the aspect of the present disclosure, in the method of manufacturing a Fabry-Perot interference filter, in the forming step, a stress adjustment layer may be formed on a second main surface of the wafer, and a second thinned region in which the stress adjustment layer is partially thinned along each of the plurality of lines may be formed. According to this configuration, it is possible to prevent warpage of the wafer caused by discordance of a layer configuration between the first main surface side and the second main surface side. Moreover, since the stress adjustment layer is partially thinned along each of the lines, it is possible to prevent damage from being caused in the stress adjustment layer when a wafer is cut into a plurality of substrates along each of the lines. The "second thinned region" includes a region from which all of the parts along each of the lines in the stress adjustment layer are removed.

According to the aspect of the present disclosure, in the method of manufacturing a Fabry-Perot interference filter, in the forming step, the first thinned region may be formed by thinning a part along each of the plurality of lines in at least the sacrificial layer and the second mirror layer. According to this configuration, when a wafer is cut into a plurality of substrates along each of the lines, it is possible to more effectively prevent a situation in which a part around the gap in the sacrificial layer, and the second mirror portion being raised in the gap are damaged.

According to the aspect of the present disclosure, in the method of manufacturing a Fabry-Perot interference filter, in the forming step, after a part along each of the plurality of lines in the sacrificial layer formed on the first mirror layer is thinned, side surfaces of the sacrificial layer facing each other along each of the plurality of lines may be covered with the second mirror layer by forming the second mirror layer on the sacrificial layer. According to this configuration, it is possible to prevent a part of the side surfaces of the sacrificial layer from being removed when the portion expected to be removed is removed from the sacrificial layer through etching. Moreover, in a manufactured Fabry-Perot interference filter, it is possible to prevent light which becomes stray light from being incident from the side surface of an intermediate layer corresponding to the side surface of the sacrificial layer.

According to the aspect of the present disclosure, in the method of manufacturing a Fabry-Perot interference filter, in the cutting step, the wafer may be cut into the plurality of substrates along each of the plurality of lines by forming a modified region within the wafer along each of the plurality of lines through irradiation of laser light and extending a crack in a thickness direction of the wafer from the modified region. According to this configuration, compared to a case in which a wafer is cut into a plurality of substrates through blade dicing, an external force is unlikely to act on a structure around the gap. Therefore, it is possible to more effectively prevent a situation in which the structure around the gap is damaged. In addition, it is possible to prevent particles generated when blade dicing is carried out, cooling rinsing water used for blade dicing, and the like from infiltrating into the gap and causing deterioration of characteristics of the Fabry-Perot interference filter.

According to the aspect of the present disclosure, in the method of manufacturing a Fabry-Perot interference filter, in the cutting step, the crack may be extended in the thickness direction of the wafer from the modified region by expanding an expanding tape attached to the second main surface side of the wafer. According to this configuration, it is possible to prevent the second mirror layer having the plurality of second mirror portions each of which is expected to function as a movable mirror from being damaged due to the attached expanding tape.

According to the aspect of the present disclosure, in the method of manufacturing a Fabry-Perot interference filter, in the cutting step, in a state in which the expanding tape is attached to the second main surface side, the laser light may be incident on the wafer from a side opposite to the expanding tape. According to this configuration, scattering, attenuation, or the like of laser light caused by the expanding tape is prevented so that the modified region can be reliably formed within the wafer along each of the lines.

According to the aspect of the present disclosure, in the method of manufacturing a Fabry-Perot interference filter, in the cutting step, in a state in which the expanding tape is attached to the second main surface side, the laser light may be incident on the wafer through the expanding tape from the expanding tape side. According to this configuration, for example, even if generated particles fall due to their own weights when irradiation of laser light is performed from above, the expanding tape functions as a cover. Therefore, it is possible to prevent such particles from adhering to the second mirror layer or the like.

Advantageous Effects of Invention

According to the present disclosure, it is possible to provide a method of manufacturing a Fabry-Perot interference filter, in which both manufacturing efficiency and a yield can be improved.

BRIEF DESCRIPTION OF DRAWINGS

FIGS. 5(a) and 5(b) are cross-sectional views for describing the method of manufacturing the Fabry-Perot interference filter in FIG. 1.

FIGS. 6(a) and 6(b) are cross-sectional views for describing the method of manufacturing the Fabry-Perot interference filter in FIG. 1.

DESCRIPTION OF EMBODIMENT

Figure 1:
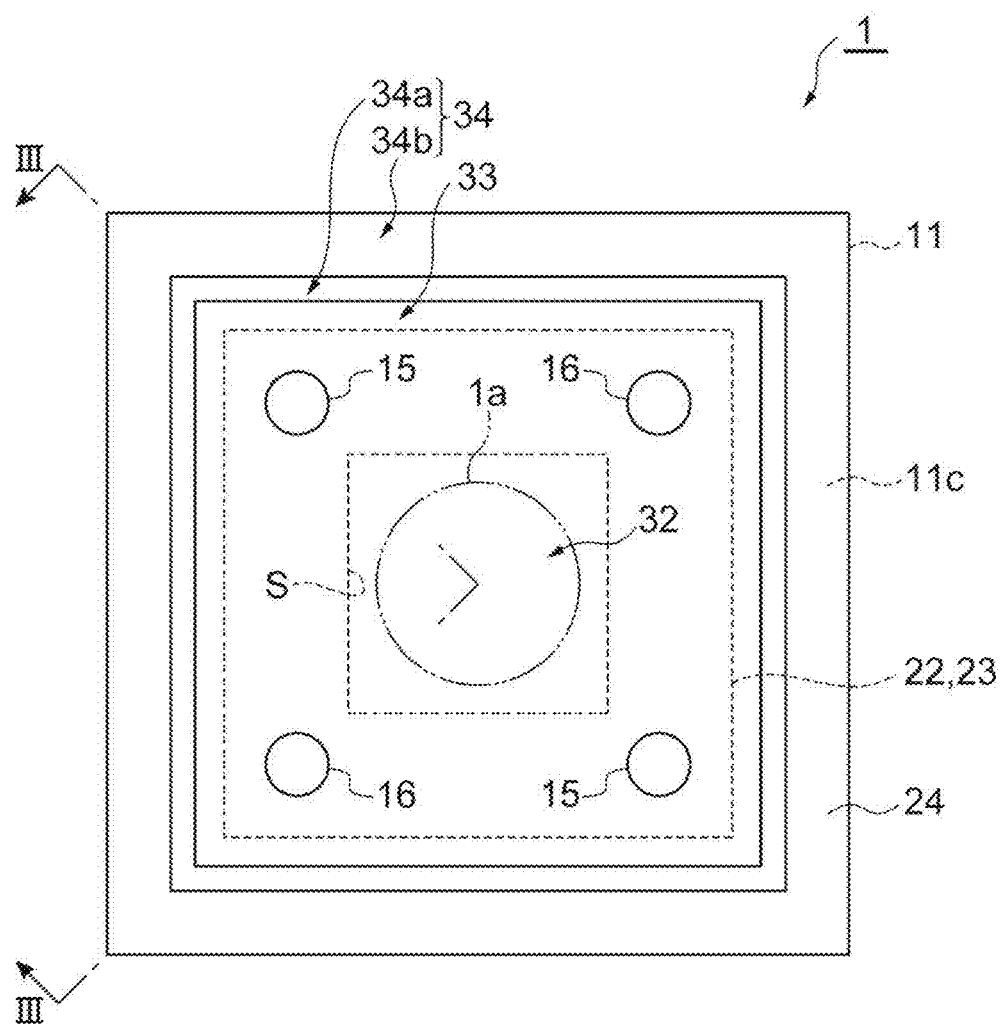
FIG. 1 is a plan view of a Fabry-Perot interference filter of an embodiment.

Hereinafter, an embodiment of the present disclosure will be described in detail with reference to the drawings. In all the drawings, the same or equivalent portions are denoted with the same reference numerals and duplicated description is omitted.

[Configuration of Fabry-Perot Interference Filter]

Figure 2:
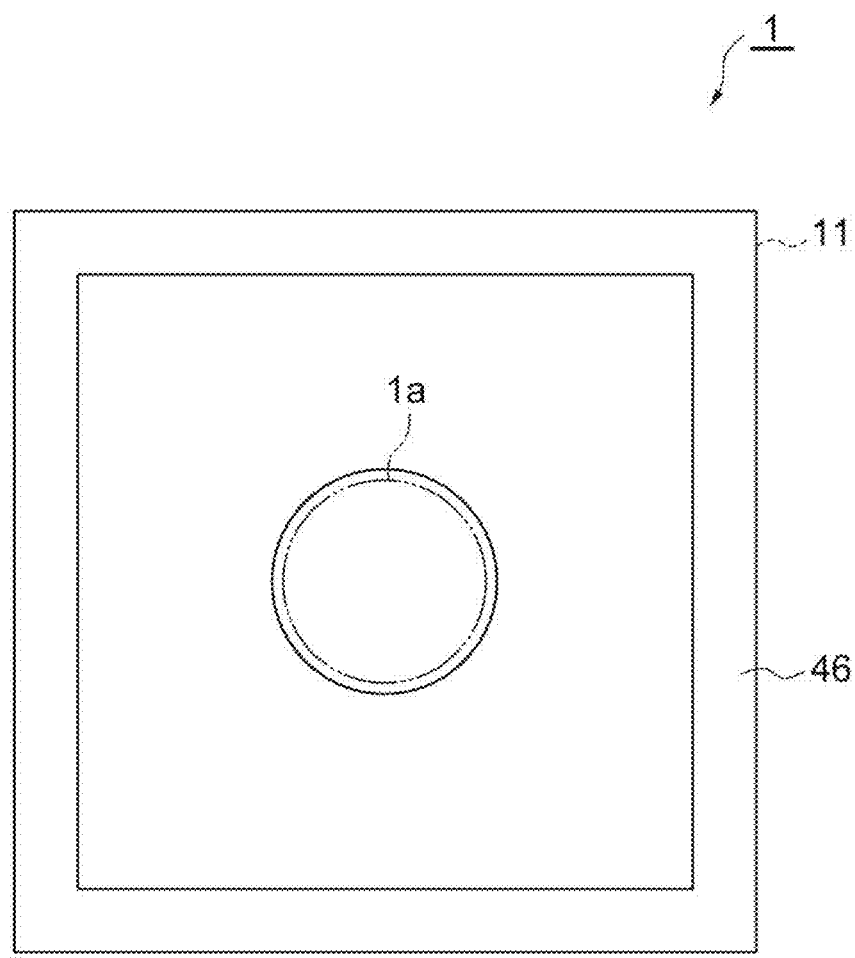
FIG. 2 is a bottom view of the Fabry-Perot interference filter in FIG. 1.
Figure 3:
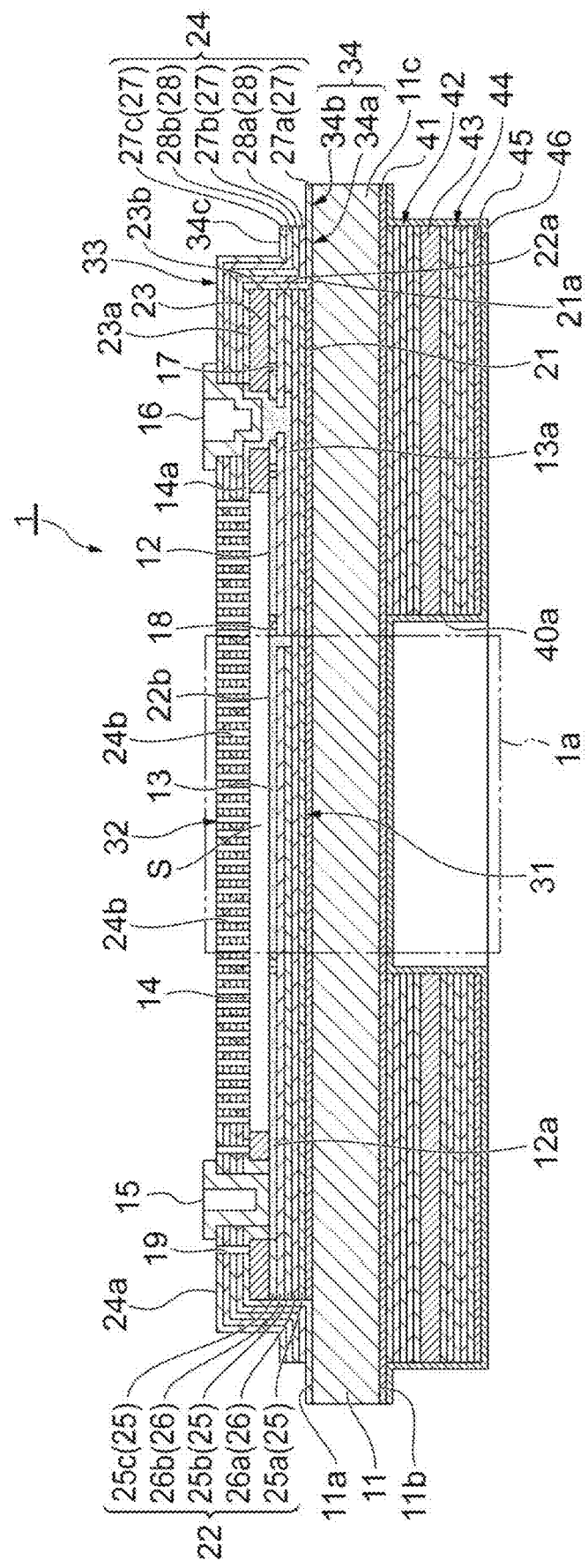
FIG. 3 is a cross-sectional view of the Fabry-Perot interference filter taken along line in FIG. 1.

As illustrated in FIGS. 1, 2, and 3, a Fabry-Perot interference filter 1 includes a substrate 11. The substrate 11 has a first surface 11a and a second surface 11b facing the first surface 11a. On the first surface 11a, a reflection prevention layer 21, a first laminate (first layer) 22, an intermediate layer 23, and a second laminate (second layer) 24 are laminated in this order. A gap (air gap) S is defined between the first laminate 22 and the second laminate 24 by the frame-shaped intermediate layer 23.

The shape and the positional relationship of each portion in a case of being seen in a direction perpendicular to the first surface 11a (plan view) are as follows. For example, an outer edge of the substrate 11 has a rectangular shape. The outer edge of the substrate 11 and an outer edge of the second laminate 24 coincide with each other. An outer edge of the reflection prevention layer 21, an outer edge of the first laminate 22, and an outer edge of the intermediate layer 23 coincide with each other. The substrate 11 has an outer edge portion 11c positioned on an outer side of the outer edge of the intermediate layer 23 with respect to the center of the gap S. For example, the outer edge portion 11c has a frame shape and surrounds the intermediate layer 23 in a case of being seen in a direction perpendicular to the first surface 11a.

In the Fabry-Perot interference filter 1, light having a predetermined wavelength is transmitted through a light transmission region 1a defined in a center portion thereof. For example, the light transmission region 1a is a columnar region. For example, the substrate 11 is made of silicon, quartz, or glass. When the substrate 11 is made of silicon, the reflection prevention layer 21 and the intermediate layer 23 are made of silicon oxide, for example. The thickness of the intermediate layer 23 ranges from several tens of nm to several tens of for example.

A part corresponding to the light transmission region 1a in the first laminate 22 functions as a first mirror portion 31. The first mirror portion 31 is disposed on the first surface 11a with the reflection prevention layer 21 interposed therebetween. The first laminate 22 is configured to have a plurality of polysilicon layers 25 and a plurality of silicon nitride layers 26 which are alternately laminated one by one. In the present embodiment, a polysilicon layer 25a, a silicon nitride layer 26a, a polysilicon layer 25b, a silicon nitride layer 26b, and a polysilicon layer 25c are laminated on the reflection prevention layer 21 in this order. The optical thickness of each of the polysilicon layers 25 and the silicon nitride layers 26 configuring the first mirror portion 31 is preferably an integral multiple of ¼ of a center transmission wavelength. The first mirror portion 31 may be directly disposed on the first surface 11a without the reflection prevention layer 21 interposed therebetween.

A part corresponding to the light transmission region 1a in the second laminate 24 functions as a second mirror portion 32. The second mirror portion 32 faces the first mirror portion 31 via the gap S on a side opposite to the substrate 11 with respect to the first mirror portion 31. The second laminate 24 is disposed on the first surface 11a with the reflection prevention layer 21, the first laminate 22, and the intermediate layer 23 interposed therebetween. The second laminate 24 is configured to include a plurality of polysilicon layers 27 and a plurality of silicon nitride layers 28 which are alternately laminated one by one. In the present embodiment, a polysilicon layer 27a, a silicon nitride layer 28a, a polysilicon layer 27b, a silicon nitride layer 28b, and a polysilicon layer 27c are laminated on the intermediate layer 23 in this order. The optical thickness of each of the polysilicon layer 27 and the silicon nitride layer 28 configuring the second mirror portion 32 is preferably an integral multiple of ¼ of the center transmission wavelength.

In the first laminate 22 and the second laminate 24, silicon oxide layers may be used in place of the silicon nitride layers. In addition, as the material of each layer configuring the first laminate 22 and the second laminate 24, titanium oxide, tantalum oxide, zirconium oxide, magnesium fluoride, aluminum oxide, calcium fluoride, silicon, germanium, zinc sulfide, or the like may be used.

In a part corresponding to the gap S in the second laminate 24, a plurality of through-holes 24b leading from a surface 24a of the second laminate 24 on a side opposite to the intermediate layer 23 to the gap S are formed. The plurality of through-holes 24b are formed so as not to substantially affect the function of the second mirror portion 32. The plurality of through-holes 24b are used for forming the gap S by removing a part of the intermediate layer 23 through etching.

In addition to the second mirror portion 32, the second laminate 24 further has a covering portion 33 and a peripheral edge portion 34. The second mirror portion 32, the covering portion 33, and the peripheral edge portion 34 are integrally formed to have a part of the same laminated structure as each other and to be connected to each other. The covering portion 33 surrounds the second mirror portion 32 in a case of being seen in a direction perpendicular to the first surface 11a. The covering portion 33 covers a surface 23a of the intermediate layer 23 on a side opposite to the substrate 11, a side surface 23b of the intermediate layer 23 (a side surface on the outer side, that is, a side surface on a side opposite to the gap S side), a side surface 22a of the first laminate 22, and a side surface 21a of the reflection prevention layer 21 and leads to the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 in a case of being seen in a direction perpendicular to the first surface 11a. The peripheral edge portion 34 is positioned on the first surface 11a in the outer edge portion 11c. An outer edge of the peripheral edge portion 34 coincides with the outer edge of the substrate 11 in a case of being seen in a direction perpendicular to the first surface 11a.

The peripheral edge portion 34 is thinned along an outer edge of the outer edge portion 11c. That is, a part along the outer edge of the outer edge portion 11c in the peripheral edge portion 34 is thinned compared to other parts excluding the part along the outer edge in the peripheral edge portion 34. In the present embodiment, the peripheral edge portion 34 is thinned by removing a part of the polysilicon layer 27 and the silicon nitride layer 28 configuring the second laminate 24. The peripheral edge portion 34 has a non-thinned portion 34a connected to the covering portion 33, and a thinned portion 34b surrounding the non-thinned portion 34a. In the thinned portion 34b, the polysilicon layer 27 and the silicon nitride layer 28 excluding the polysilicon layer 27a directly provided on the first surface 11a are removed.

The height of a surface 34c of the non-thinned portion 34a on a side opposite to the substrate 11 from the first surface 11a is lower than the height of the surface 23a of the intermediate layer 23 from the first surface 11a. The height of the surface 34c of the non-thinned portion 34a from the first surface 11a ranges from 100 nm to 5,000 nm, for example. The height of the surface 23a of the intermediate layer 23 from the first surface 11a is a height greater than the height of the surface 34c of the non-thinned portion 34a from the first surface 11a within a range from 500 nm to 20,000 nm, for example. The width of the thinned portion 34b (distance between an outer edge of the non-thinned portion 34a and the outer edge of the outer edge portion 11c) is equal to or greater than 0.01 times the thickness of the substrate 11. The width of the thinned portion 34b ranges from 5 μm to 400 μm, for example. The thickness of the substrate 11 ranges from 500 μm to 800 μm, for example.

A first electrode 12 is formed in the first mirror portion 31 such that the light transmission region 1a is surrounded. The first electrode 12 is formed by doping impurities into the polysilicon layer 25c and decreasing resistance. A second electrode 13 is formed in the first mirror portion 31 such that the light transmission region 1a is included. The second electrode 13 is formed by doping impurities into the polysilicon layer 25c and decreasing resistance. The size of the second electrode 13 is preferably a size for including the entirety of the light transmission region 1a. However, the size may be approximately the same as the size of the light transmission region 1a.

A third electrode 14 is formed in the second mirror portion 32. The third electrode 14 faces the first electrode 12 and the second electrode 13 via the gap S. The third electrode 14 is formed by doping impurities into the polysilicon layer 27a and decreasing resistance.

A pair of terminals 15 are provided to face each other while having the light transmission region 1a therebetween. Each of the terminals 15 is disposed inside a through-hole leading from the surface 24a of the second laminate 24 to the first laminate 22. Each of the terminals 15 is electrically connected to the first electrode 12 through a wiring 12a. For example, the terminals 15 are formed from a metal film made of aluminum or an alloy thereof.

A pair of terminals 16 are provided to face each other while having the light transmission region 1a therebetween. Each of the terminals 16 is disposed inside a through-hole leading from the surface 24a of the second laminate 24 to the first laminate 22. Each of the terminals 16 is electrically connected to the second electrode 13 through a wiring 13a and is electrically connected to the third electrode 14 through a wiring 14a. For example, the terminals 16 are formed from a metal film made of aluminum or an alloy thereof. The facing direction of the pair of terminals 15 and the facing direction of the pair of terminals 16 are orthogonal to each other (refer to FIG. 1).

Trenches 17 and 18 are provided on a surface 22b of the first laminate 22. The trench 17 annularly extends to surround a connection part with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13). Each of the regions within the trenches 17 and 18 may be an insulating material or a gap.

A trench 19 is provided on the surface 24a of the second laminate 24. The trench 19 annularly extends to surround the terminals 15. The trench 19 electrically insulates the terminals 15 and the third electrode 14. The region inside the trench 19 may be an insulating material or a gap.

A reflection prevention layer 41, a third laminate (third layer) 42, an intermediate layer (third layer) 43, and a fourth laminate (third layer) 44 are laminated on the second surface 11b of the substrate 11 in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 based on the substrate 11. The reflection prevention layer 41, the third laminate 42, the intermediate layer 43, and the fourth laminate 44 have a function of preventing warpage of the substrate 11.

The third laminate 42, the intermediate layer 43, and the fourth laminate 44 are thinned along the outer edge of the outer edge portion 11c. That is, the part along the outer edge of the outer edge portion 11c in the third laminate 42, the intermediate layer 43, and the fourth laminate 44 is thinned compared to other parts excluding a part along an outer edge in the third laminate 42, the intermediate layer 43, and the fourth laminate 44. In the present embodiment, the third laminate 42, the intermediate layer 43, and the fourth laminate 44 are thinned by removing the entirety of the third laminate 42, the intermediate layer 43, and the fourth laminate 44 in a part overlapping the thinned portion 34b in a case of being seen in a direction perpendicular to the first surface 11a.

An opening 40a is provided in the third laminate 42, the intermediate layer 43, and the fourth laminate 44 such that the light transmission region 1a is included. The opening 40a has a diameter approximately the same as the size of the light transmission region 1a. The opening 40a is open on a light emission side, and a bottom surface of the opening 40a leads to the reflection prevention layer 41.

A light shielding layer 45 is formed on a surface of the fourth laminate 44 on the light emission side. For example, the light shielding layer 45 is made of aluminum. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is made of aluminum oxide. An optical influence due to the protective layer 46 can be disregarded by causing the thickness of the protective layer 46 to range from 1 to 100 nm (preferably, approximately 30 nm).

In the Fabry-Perot interference filter 1 configured as described above, if a voltage is applied to a location between the first electrode 12 and the third electrode 14 through the terminals 15 and 16, an electrostatic force corresponding to the voltage is generated between the first electrode 12 and the third electrode 14. The second mirror portion 32 is attracted to the first mirror portion 31 side fixed to the substrate 11 due to the electrostatic force, and the distance between the first mirror portion 31 and the second mirror portion 32 is adjusted. In this way, in the Fabry-Perot interference filter 1, the distance between the first mirror portion 31 and the second mirror portion 32 is changeable.

The wavelength of light transmitted through the Fabry-Perot interference filter 1 depends on the distance between the first mirror portion 31 and the second mirror portion 32 in the light transmission region 1a. Therefore, the wavelength of transmitted light can be suitably selected by adjusting the voltage to be applied to a location between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while the voltage to be applied to the Fabry-Perot interference filter 1 is changed (that is, while the distance between the first mirror portion 31 and the second mirror portion 32 is changed in the Fabry-Perot interference filter 1).

As described above, in the Fabry-Perot interference filter 1, in addition to the second mirror portion 32, the second laminate 24 further includes the covering portion 33 covering the intermediate layer 23, and the peripheral edge portion 34 positioned on the first surface 11a in the outer edge portion 11c. The second mirror portion 32, the covering portion 33, and the peripheral edge portion 34 are integrally formed in a manner of being connected to each other. Accordingly, the intermediate layer 23 is covered with the second laminate 24, so that the intermediate layer 23 is prevented from peeling. In addition, since the intermediate layer 23 is covered with the second laminate 24, even when the gap S is formed in the intermediate layer 23 through etching, for example, the intermediate layer 23 is prevented from deteriorating. As a result, stability of the intermediate layer 23 is improved. Moreover, in the Fabry-Perot interference filter 1, the peripheral edge portion 34 is thinned along the outer edge of the outer edge portion 11c. Accordingly, for example, even when a wafer including a part corresponding to the substrate 11 is cut along the outer edge of the outer edge portion 11c and the Fabry-Perot interference filter 1 is obtained, each layer on the substrate 11 is prevented from deteriorating. As a result, stability of each layer on a substrate is improved. As described above, according to the Fabry-Perot interference filter 1, it is possible to prevent peeling caused in each layer on the substrate 11. Moreover, in the Fabry-Perot interference filter 1, since the side surface 23b of the inter mediate layer 23 is covered with the second laminate 24, light can be prevented from entering from the side surface 23b of the intermediate layer 23, so that it is possible to prevent generation of stray light.

In addition, in the Fabry-Perot interference filter 1, the covering portion 33 covers the outer edge of the first laminate 22. Accordingly, it is possible to more reliably prevent the first laminate 22 from peeling. Moreover, for example, even when a wafer including a part corresponding to the substrate 11 is cut along the outer edge of the outer edge portion 11c and the Fabry-Perot interference filter 1 is obtained, it is possible to more favorably prevent the first laminate 22 from deteriorating.

In addition, in the Fabry-Perot interference filter 1, an outer edge of the silicon nitride layer 26 included in the first laminate 22 is covered with the covering portion 33. Accordingly, the silicon nitride layer 26 of the first laminate 22 is not exposed to the outside. Therefore, for example, even when the gap S is formed in the intermediate layer 23 through etching using hydrofluoric acid gas, it is possible to prevent a residue from being generated due to reaction between the hydrofluoric acid gas and the silicon nitride layer 26.

In addition, in the Fabry-Perot interference filter 1, since a part of the polysilicon layer 27 and the silicon nitride layer 28 configuring the second laminate 24 is removed, the Fabry-Perot interference filter 1 is thinned along the outer edge of the outer edge portion 11c. Accordingly, the first surface 11a of the substrate 11 can be protected by the remaining parts which have not removed from the polysilicon layer 27 and the silicon nitride layer 28 configuring the second laminate 24. Moreover, in the Fabry-Perot interference filter 1, only the polysilicon layer 27a remains in the thinned portion 34b. Accordingly, the surface of the thinned portion 34b becomes smooth. Therefore, for example, even when laser light is converged within a wafer along the outer edge of the outer edge portion 11c in order to cut the wafer including a part corresponding to the substrate 11 along the outer edge of the outer edge portion 11c, the laser light can be favorably converged within the wafer and the wafer can be precisely cut, so that it is possible to more favorably prevent each layer on the substrate 11 from deteriorating.

In addition, in the Fabry-Perot interference filter 1, the third laminate 42 and the fourth laminate 44 are disposed on the second surface 11b of the substrate 11, and the third laminate 42 and the fourth laminate 44 are thinned along the outer edge of the outer edge portion 11c. Accordingly, it is possible to prevent warpage of the substrate 11 caused by discordance of the layer configuration between the first surface 11a side and the second surface 11b side of the substrate 11. Moreover, for example, even when a wafer including a part corresponding to the substrate 11 is cut along the outer edge of the outer edge portion 11c and the Fabry-Perot interference filter 1 is obtained, the third laminate 42 and the fourth laminate 44 are prevented from deteriorating. As a result, stability of each layer on the substrate 11 is improved.

[Method of Manufacturing Fabry-Perot Interference Filter]

Figure 4:
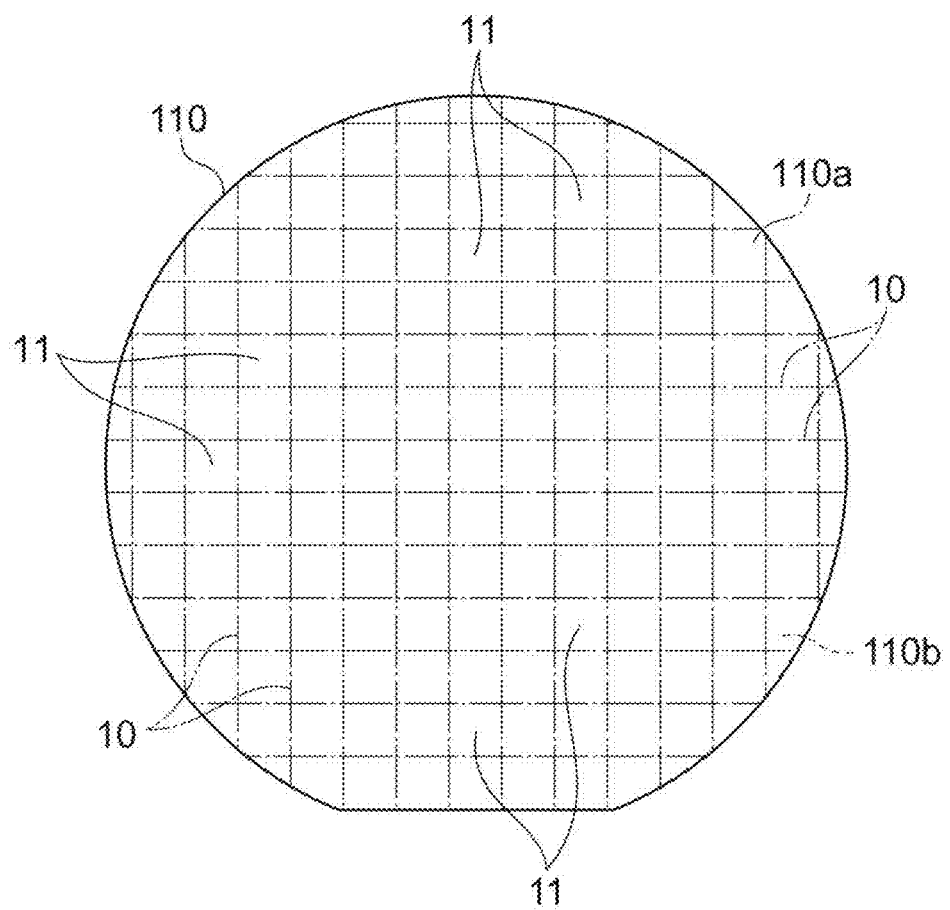
FIG. 4 is a plan view of a wafer used in a method of manufacturing the Fabry-Perot interference filter in FIG. 1.
Figure 7:
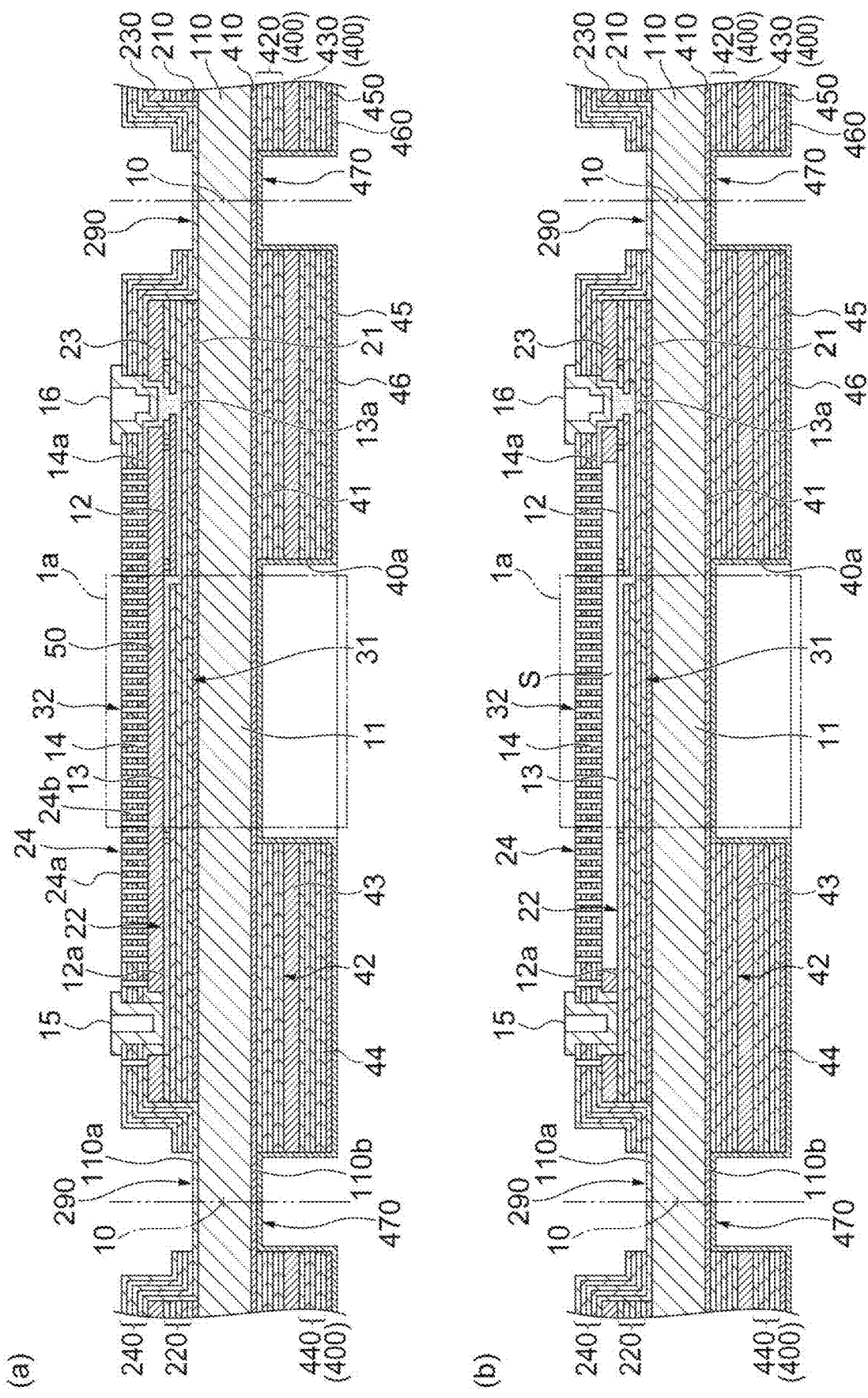
FIGS. 7(a) and 7(b) are cross-sectional views for describing the method of manufacturing the Fabry-Perot interference filter in FIG. 1.

First, as illustrated in FIG. 4, a wafer 110 is prepared. The wafer 110 is a wafer including parts corresponding to a plurality of substrates 11 arranged in a two-dimensional state and being expected to be cut into the plurality of substrates 11 along each of a plurality of lines 10. The wafer 110 has a first main surface 110a and a second main surface 110b facing each other. For example, the wafer 110 is made of silicon, quartz, or glass. As an example, when each of the substrates 11 exhibits a rectangular shape in a case of being seen in a direction perpendicular to the first main surface 110a, the plurality of substrates 11 are arranged in a two-dimensional matrix state, and the plurality of lines 10 are set in a lattice state to pass through a location between the substrates 11 adjacent to each other.

Subsequently, as illustrated in FIGS. 5(a) to 7(a), a forming step is carried out. In the forming step, a reflection prevention layer 210, a first mirror layer 220, a sacrificial layer 230, a second mirror layer 240, and a first thinned region 290 are formed on the first main surface 110a of the wafer 110 (refer to FIG. 7(a)). In addition, in the forming step, a stress adjustment layer 400, a light shielding layer 450, a protective layer 460, and a second thinned region 470 are formed on the second main surface 110b of the wafer 110 (refer to FIG. 7(a)).

Specifically, as illustrated in FIG. 5(a), the reflection prevention layer 210 is formed on the first main surface 110a of the wafer 110, and a reflection prevention layer 410 is formed on the second main surface 110b of the wafer 110. The reflection prevention layer 210 is a layer expected to be cut into a plurality of reflection prevention layers 21 along each of the lines 10. The reflection prevention layer 410 is a layer expected to be cut into a plurality of reflection prevention layers 41 along each of the lines 10.

Subsequently, a plurality of polysilicon layers and a plurality of silicon nitride layers are alternately laminated on each of the reflection prevention layers 210 and 410, so that the first mirror layer 220 is formed on the reflection prevention layer 210 and a layer 420 configuring the stress adjustment layer 400 is formed on the reflection prevention layer 410. The first mirror layer 220 is a layer having a plurality of first mirror portions 31 each of which is expected to function as a fixed mirror and is a layer expected to be cut into a plurality of first laminates 22 along each of the lines 10. The layer 420 configuring the stress adjustment layer 400 is a layer expected to be cut into a plurality of third laminates 42 along each of the lines 10.

When the first mirror layer 220 is formed, a part along each of the lines 10 in the first mirror layer 220 is removed through etching, such that a surface of the reflection prevention layer 210 is exposed. In addition, a predetermined polysilicon layer in the first mirror layer 220 is partially decreased in resistance by doping impurities, so that the first electrode 12, the second electrode 13, and the wirings 12a and 13a are formed in each part corresponding to the substrate 11. Moreover, the trenches 17 and 18 are formed on a surface of the first mirror layer 220 in each part corresponding to the substrate 11 through etching.

Subsequently, as illustrated in FIG. 5(b), the sacrificial layer 230 is formed on the first mirror layer 220 and the exposed surface of the reflection prevention layer 210, and a layer 430 configuring the stress adjustment layer 400 is formed on the layer 420 configuring the stress adjustment layer 400. The sacrificial layer 230 is a layer having a plurality of portions 50 expected to be removed and is a layer expected to be cut into a plurality of intermediate layers 23 along each of the lines 10. The portion 50 expected to be removed is a part corresponding to the gap S (refer to FIG. 3). The layer 430 configuring the stress adjustment layer 400 is a layer expected to be cut into a plurality of intermediate layers 43 along each of the lines 10.

Subsequently, a part along each of the lines 10 in the sacrificial layer 230 and the reflection prevention layer 210 is removed through etching, such that the first main surface 110a of the wafer 110 is exposed. In addition, through the etching, in each part corresponding to the substrate 11, a gap is formed in a part corresponding to each of the terminals 15 and 16 (refer to FIG. 3) in the sacrificial layer 230.

Subsequently, as illustrated in FIG. 6(a), a plurality of polysilicon layers and a plurality of silicon nitride layers are alternately laminated on each of the first main surface 110a side and the second main surface 110b side of the wafer 110, so that the second mirror layer 240 is formed on the sacrificial layer 230 and the exposed first main surface 110a of the wafer 110, and a layer 440 configuring the stress adjustment layer 400 is formed on the layer 430 configuring the stress adjustment layer 400. The second mirror layer 240 is a layer having a plurality of second mirror portions 32 each of which is expected to function as a movable mirror and is a layer expected to be cut into a plurality of second laminates 24 along each of the lines 10. The layer 440 configuring the stress adjustment layer 400 is a layer expected to be cut into a plurality of fourth laminates 44 along each of the lines 10.

When the second mirror layer 240 is formed, side surfaces 230a of the sacrificial layer 230, side surfaces 220a of the first mirror layer 220, and side surfaces 210a of the reflection prevention layer 210, facing each other along the line 10, are covered with the second mirror layer 240. In addition, a predetermined polysilicon layer in the second mirror layer 240 is partially decreased in resistance by doping impurities, so that the third electrode 14 and the wiring 14a are formed in each part corresponding to the substrate 11.

Subsequently, as illustrated in FIG. 6(b), through etching, a part along each of the lines 10 in the second mirror layer 240 is thinned, such that the surface of the polysilicon layer 27a (refer to FIG. 3) included in the second mirror layer 240 (that is, the polysilicon layer positioned closest to the first main surface 110a side) is exposed. In addition, through the etching, in each part corresponding to the substrate 11, a gap is formed in a part corresponding to each of the terminals 15 and 16 (refer to FIG. 3) in the second mirror layer 240. Subsequently, in each part corresponding to the substrate 11, the terminals 15 and 16 are formed in the gap, the terminal 15 and the wiring 12a are connected to each other, and the terminal 16 and each of the wiring 13a and the wiring 14a are connected to each other.

Up to this point, the reflection prevention layer 210, the first mirror layer 220, the sacrificial layer 230, the second mirror layer 240, and the first thinned region 290 have been formed on the first main surface 110a of the wafer 110. The first thinned region 290 is a region in which the first mirror layer 220, the sacrificial layer 230, and the second mirror layer 240 are partially thinned along each of the lines 10. The reflection prevention layer 210, the first mirror layer 220, the sacrificial layer 230, and the second mirror layer 240 are formed such that one reflection prevention layer 21, one first mirror portion 31, one portion 50 expected to be removed, and one second mirror portion 32 are disposed from one substrate 11 side in this order (that is, in order of one reflection prevention layer 21, one first mirror portion 31, one portion 50 expected to be removed, and one second mirror portion 32).

Subsequently, as illustrated in FIG. 7(a), in each part corresponding to the substrate 11, the plurality of through-holes 24b leading from the surface 24a of the second laminate 24 to the portion 50 expected to be removed are formed in the second laminate 24 through etching. Subsequently, the light shielding layer 450 is formed on the layer 440 configuring the stress adjustment layer 400. The light shielding layer 450 is a layer expected to be cut into a plurality of light shielding layers 45 along each of the lines 10. Subsequently, a part along each of the lines 10 in the light shielding layer 450 and the stress adjustment layer 400 (that is, the layers 420, 430, and 440) is removed through etching, such that the surface of the reflection prevention layer 410 is exposed. In addition, the opening 40a is formed in each part corresponding to the substrate 11 through the etching. Subsequently, the protective layer 460 is formed on the light shielding layer 450, the exposed surface of the reflection prevention layer 410, an inner surface of the opening 40a, and the side surface of the stress adjustment layer 400 facing the second thinned region 470. The protective layer 460 is a layer expected to be cut into a plurality of protective layers 46 along each of the lines 10.

Up to this point, the stress adjustment layer 400, the light shielding layer 450, the protective layer 460, and the second thinned region 470 have been formed on the second main surface 110b of the wafer 110. The second thinned region 470 is a region in which the stress adjustment layer 400 is partially thinned along each of the lines 10.

Subsequent to the forming step described above, as illustrated in FIG. 7(b), a removing step is carried out. Specifically, the plurality of portions 50 expected to be removed are removed all at the same time from the sacrificial layer 230 through etching (for example, gas phase etching using hydrofluoric acid gas) via the plurality of through-holes 24b. Accordingly, the gap S is formed in each part corresponding to the substrate 11.

Figure 8:
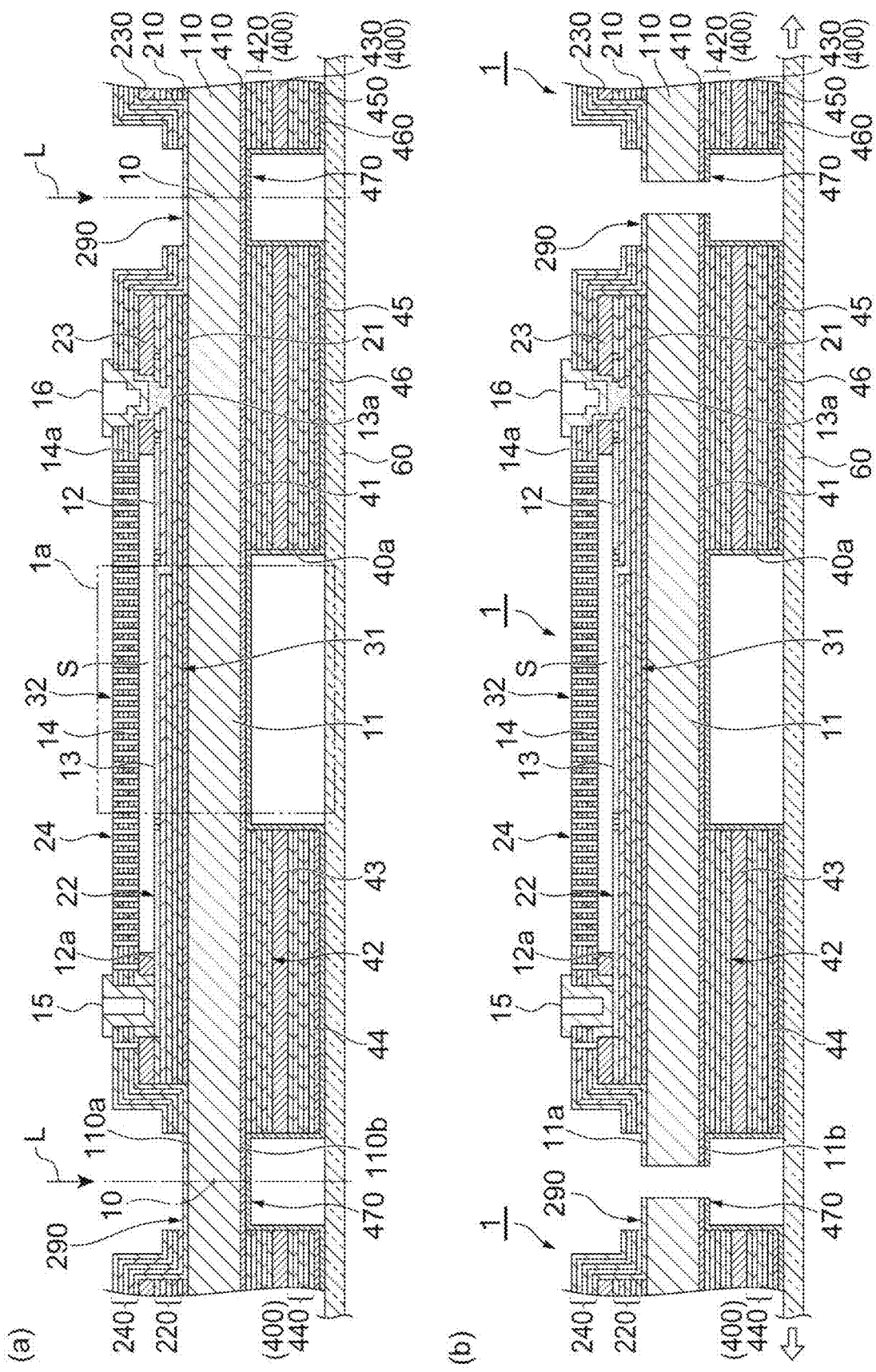
FIGS. 8(a) and 8(b) are cross-sectional views for describing the method of manufacturing the Fabry-Perot interference filter in FIG. 1.

Subsequently, as illustrated in FIGS. 8(a) and 8(b), a cutting step is carried out. Specifically, as illustrated in FIG. 8(a), an expanding tape 60 is attached onto the protective layer 460 (that is, to the second main surface 110b side). Subsequently, in a state in which the expanding tape 60 is attached to the second main surface 110b side, irradiation of laser light L is performed from a side opposite to the expanding tape 60, and a converging point of the laser light L is relatively moved along each of the lines 10 while the converging point of the laser light L is positioned within the wafer 110. That is, the laser light L is incident on the wafer 110 from a side opposite to the expanding tape 60 through the surface of the polysilicon layer exposed in the first thinned region 290.

Then, a modified region is formed within the wafer 110 along each of the lines 10 through irradiation of the laser light L. The modified region indicates a region in which density, a refractive index, mechanical strength, and other physical characteristics are in a state different from that in the surrounding area, that is, a region which becomes a start point of a crack extended in a thickness direction of the wafer 110. Examples of the modified region include molten processed regions (which means at least any one of a region resolidified after melting, a region in a melted state, and a region in a state of being resolidified from the melted state), a crack region, a dielectric breakdown region, a refractive index changed region, and a mixed region thereof. Further, there are a region where the density of the modified region has changed from that of an unmodified region and a region formed with a lattice defect in the material of the wafer 110 as the modified region. When the material of the wafer 110 is monocrystalline silicon, the modified region can also be referred to as a high-dislocation density region. The number of rows of the modified regions arranged in the thickness direction of the wafer 110 with respect to each of the lines 10 is appropriately adjusted based on the thickness of the wafer 110.

Subsequently, as illustrated in FIG. 8(b), the expanding tape 60 attached to the second main surface 110b side is expanded, so that a crack is extended in the thickness direction of the wafer 110 from the modified region formed within the wafer 110, and the wafer 110 is then cut into the plurality of substrates 11 along each of the lines 10. At this time, the polysilicon layer of the second mirror layer 240 is cut along each of the lines 10 in the first thinned region 290, and the reflection prevention layer 410 and the protective layer 460 are cut along each of the lines 10 in the second thinned region 470. Accordingly, a plurality of Fabry-Perot interference filters 1 in a state of being separated from each other on the expanding tape 60 are obtained.

As described above, in the method of manufacturing the Fabry-Perot interference filter 1, the removing step of removing the plurality of portions 50 expected to be removed from the sacrificial layer 230 through etching is carried out at a wafer level. Accordingly, compared to a case in which the removing step is individually carried out at a chip level, it is possible to form the gap S between the first mirror portion 31 and the second mirror portion 32 in a significantly efficient way. Furthermore, since a process proceeds simultaneously in a part corresponding to an arbitrary substrate 11 within the wafer 110 and parts corresponding to the surrounding substrates 11 around the substrate, for example, since etching of the sacrificial layer 230 is simultaneously carried out with respect to the plurality of two dimensionally arranged portions 50 expected to be removed, a bias of in-plane stress in the wafer 110 can be reduced. Thus, according to the method of manufacturing the Fabry-Perot interference filter 1, both manufacturing efficiency and a yield can be improved, and the Fabry-Perot interference filter 1 with high quality can be stably mass-produced.

In addition, in the method of manufacturing the Fabry-Perot interference filter 1, in the forming step, the first thinned region 290 in which at least one of the first mirror layer 220, the sacrificial layer 230, and the second mirror layer 240 is partially thinned along each of the lines 10 is formed. In the cutting step of cutting the wafer 110 into a plurality of substrates 11 along each of the lines 10, although parts respectively corresponding to the second mirror portions 32 in the second mirror layer 240 are in a state of being raised in the gap S, the first thinned region 290 thinned along each of the lines 10 is formed in advance. Therefore, compared to a case in which the first thinned region 290 is not formed, an external force is unlikely to act on a structure around the gap S. As a result, it is possible to effectively prevent a situation in which the structure around the gap S is damaged (if the first thinned region 290 is not formed, an impact, stress, or the like is transferred to the first mirror layer 220, the sacrificial layer 230, and the second mirror layer 240 so that damage is likely to be caused when the wafer 110 is cut into the plurality of substrates 11 along each of the lines 10).

In addition, in the method of manufacturing the Fabry-Perot interference filter 1, in the forming step, the stress adjustment layer 400 is formed on the second main surface 110b of the wafer 110, and the second thinned region 470 in which the stress adjustment layer 400 is partially thinned along each of the lines 10 is formed. Accordingly, it is possible to prevent warpage of the wafer 110 caused by discordance of the layer configuration between the first main surface 110a side and the second main surface 110b side. Moreover, since the stress adjustment layer 400 is partially thinned along each of the lines 10, it is possible to prevent damage from being caused in the stress adjustment layer 400 such as a part around the opening 40a when the wafer 110 is cut into the plurality of substrates 11 along each of the lines 10, (if the second thinned region 470 is not formed, an impact, stress, or the like is transferred to the stress adjustment layer 400 such as a part around the opening 40a so that damage is likely to be caused when the wafer 110 is cut into the plurality of substrates 11 along each of the lines 10).

Particularly, in the Fabry-Perot interference filter 1, since the first mirror layer 220, the sacrificial layer 230, and the second mirror layer 240 formed on the first main surface 110a of the wafer 110, and the stress adjustment layer 400 formed on the second main surface 110b of the wafer 110 have thin and elaborate layer structures, if the first thinned region 290 and the second thinned region 470 are not formed before the cutting step is carried out, damage is likely to be caused in the layer structure in the cutting step. This becomes noticeable because a force acts such that the layer structure is torn off when carrying out the cutting step in which the crack is extended from the modified region by expanding the expanding tape 60. In the method of manufacturing the Fabry-Perot interference filter 1, the first thinned region 290 and the second thinned region 470 are formed before the cutting step is carried out, so that it is possible to carry out laser processing with less contamination during a dry process (internal processing-type laser processing for forming a modified region within the wafer 110) while damage is prevented from being caused in the layer structure.

The above description is based on the following knowledge found out by the inventor, such as "although each of the first mirror layer 220, the sacrificial layer 230, the second mirror layer 240, and the stress adjustment layer 400 has a thin layer structure, it is difficult to stably form a modified region leading to the inside of the layers thereof through irradiation of the laser light L" and "in contrast, since each of the first mirror layer 220, the sacrificial layer 230, the second mirror layer 240, and the stress adjustment layer 400 has a thin layer structure, the layers are likely to be torn off and be greatly damaged unless the first thinned region 290 and the second thinned region 470 are formed".

In addition, in the method of manufacturing the Fabry-Perot interference filter 1, the forming step is carried out to form the first mirror layer 220, the sacrificial layer 230, the second mirror layer 240, and the first thinned region 290 on the first main surface 110a of the wafer 110 and to form the stress adjustment layer 400 and the second thinned region 470 on the second main surface 110b of the wafer 110. Thereafter, the removing step is carried out to remove the portion 50 expected to be removed from the sacrificial layer 230. Accordingly, the removing step is carried out in a state in which internal stress of the wafer 110 is reduced. Therefore, it is possible to prevent a strain, deformation, or the like from being generated in the first mirror portion 31 and the second mirror portion 32 facing each other via the gap S. For example, if at least forming of the second thinned region 470 is carried out after the portion 50 expected to be removed is removed from the sacrificial layer 230, a strain, deformation, or the like is likely to be generated in the first mirror portion 31 and the second mirror portion 32 facing each other via the gap S, so that it is difficult to obtain the Fabry-Perot interference filter 1 having desired characteristics.

In addition, in the method of manufacturing the Fabry-Perot interference filter 1, in the forming step, the first thinned region 290 is formed by thinning a part along each of the lines 10 in at least the sacrificial layer 230 and the second mirror layer 240. Accordingly, when the wafer 110 is cut into a plurality of substrates 11 along each of the lines 10, it is possible to more effectively prevent a situation in which a part around the gap S in the sacrificial layer 230, and the second mirror portion 32 being raised in the gap S are damaged.

In addition, in the method of manufacturing the Fabry-Perot interference filter 1, in the forming step, after a part along each of the lines 10 in the sacrificial layer 230 formed on the first mirror layer 220 is thinned, the side surfaces 230a of the sacrificial layer 230 facing each other along each of the lines 10 are covered with the second mirror layer 240 by forming the second mirror layer 240 on the sacrificial layer 230. Accordingly, it is possible to prevent a part of the side surfaces 230a of the sacrificial layer 230 from being removed (eroded) when the portion 50 expected to be removed is removed from the sacrificial layer 230 through etching. Moreover, in the manufactured Fabry-Perot interference filter 1, it is possible to prevent light which becomes stray light from being incident from the side surface 23b of the intermediate layer 23 corresponding to the side surface 230a of the sacrificial layer 230.

In addition, in the method of manufacturing the Fabry-Perot interference filter 1, in the cutting step, the wafer 110 is cut into the plurality of substrates 11 along each of the lines 10 by forming a modified region within the wafer 110 along each of the lines 10 through irradiation of the laser light L and extending a crack in the thickness direction of the wafer 110 from the modified region. Accordingly, compared to a case in which the wafer 110 is cut into the plurality of substrates 11 through blade dicing, an external force is unlikely to act on a structure around the gap S. Therefore, it is possible to more effectively prevent a situation in which the structure around the gap S is damaged. In addition, it is possible to prevent particles generated when blade dicing is carried out, cooling rinsing water used for blade dicing, and the like from infiltrating into the gap S and causing deterioration of characteristics of the Fabry-Perot interference filter 1.

In addition, in the method of manufacturing the Fabry-Perot interference filter 1, in the cutting step, a crack is extended in the thickness direction of the wafer 110 from the modified region by expanding the expanding tape 60 attached to the second main surface 110b side of the wafer 110. Accordingly, it is possible to prevent damage from being caused due to the attached expanding tape 60 in the second mirror layer 240 having the plurality of second mirror portions 32 each of which is expected to function as the movable mirror. Moreover, since an expanding force of the expanding tape 60 is likely to be concentrated in the modified region and a part in the vicinity thereof due to the presence of the second thinned region 470, the crack can be easily extended in the thickness direction of the wafer 110 from the modified region.

In addition, in the method of manufacturing the Fabry-Perot interference filter 1, in the cutting step, in a state in which the expanding tape 60 is attached to the second main surface 110b side, the laser light L is incident on the wafer 110 from a side opposite to the expanding tape 60. Accordingly, scattering, attenuation, or the like of the laser light L caused by the expanding tape 60 is prevented so that the modified region can be reliably formed within the wafer 110 along each of the lines 10.

Incidentally, in the cutting step performed through blade dicing or the like, as a matter of concern to a possibility that the second mirror portion 32 may be damaged, in the related art, the removing step of removing the portion 50 expected to be removed from the sacrificial layer 230 through etching has been carried out after the cutting step of cutting the wafer 110 into the plurality of substrates 11 along each of the lines 10. The inventor has found that "the second mirror portion 32 having a thin and elaborate layer structure can be prevented from being damaged by simultaneously performing etching of the sacrificial layer 230 with respect to the plurality of two-dimensionally arranged portions 50 expected to be removed and performing the cutting step after reducing stress acting within a plane of the wafer 110, that is, between the substrates 11 adjacent to each other". Therefore, it is preferable that etching of the sacrificial layer 230 with respect to the plurality of portions 50 expected to be removed be simultaneously carried out with respect to an arbitrary substrate 11 and the plurality of portions 50 expected to be removed corresponding to the plurality of substrates 11 adjacent to the substrate 11 and surrounding the substrate 11, in the substrates 11 two-dimensionally arranged within a plane of the wafer 110.

Modification Example

Hereinabove, the embodiment of the present disclosure has been described. However, the method of manufacturing a Fabry-Perot interference filter of the present disclosure is not limited to the embodiment described above. For example, the material and the shape of each configuration are not limited to the materials and the shapes described above, and it is possible to employ various materials and shapes.

In addition, the order of forming each of the layers and each of the regions in the forming step is not limited to that described above. As an example, the first thinned region 290 may be formed by forming the first mirror layer 220, the sacrificial layer 230, and the second mirror layer 240 on the first main surface 110a of the wafer 110, and then thinning a part along each of the lines 10 in the first mirror layer 220, the sacrificial layer 230, and the second mirror layer 240. In addition, the first thinned region 290 and the second thinned region 470 may be formed after forming the first mirror layer 220, the sacrificial layer 230, and the second mirror layer 240 on the first main surface 110a of the wafer 110, and forming the stress adjustment layer 400 on the second main surface 110b of the wafer 110.

In addition, the first thinned region 290 need only be a region in which at least one of the first mirror layer 220, the sacrificial layer 230, and the second mirror layer 240 is partially thinned along each of the lines 10. Therefore, the first thinned region 290 may be a region from which all of the parts along each of the lines 10 in all of the layers on the first main surface 110a side including the first mirror layer 220, the sacrificial layer 230, and the second mirror layer 240 are removed. In the forming step, the first thinned region 290 does not have to be formed.

In addition, the second thinned region 470 need only be a region in which at least a part of the stress adjustment layer 400 is partially thinned along each of the lines 10. Therefore, the second thinned region 470 may be a region from which all of the parts along each of the lines 10 in all of the layers on the second main surface 110b side including the stress adjustment layer 400 are removed. In the forming step, the second thinned region 470 does not have to be formed. Moreover, the stress adjustment layer 400 itself does not have to be formed.

Figure 9:
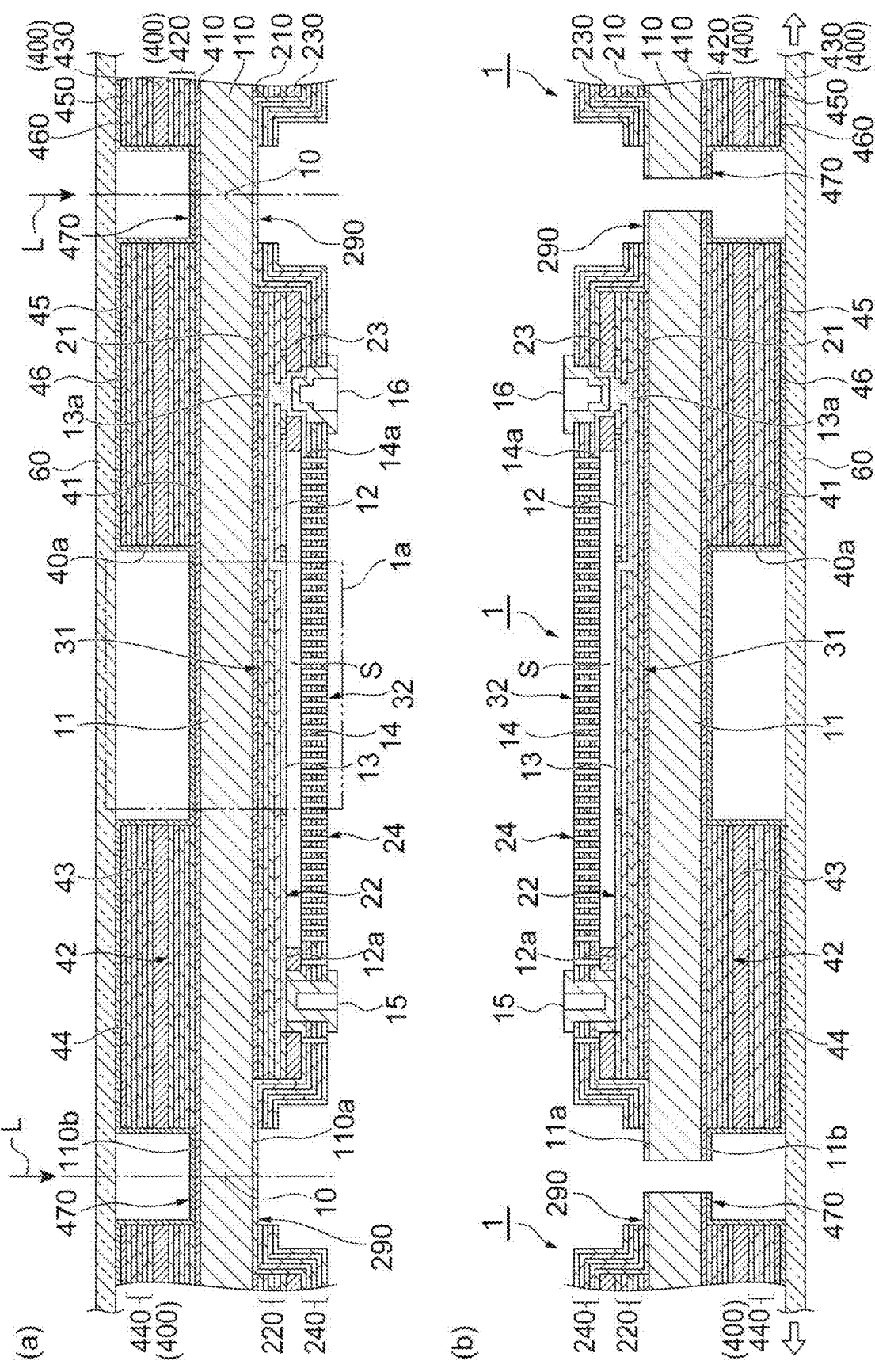
FIGS. 9(a) and 9(b) are cross-sectional views for describing the method of manufacturing the Fabry-Perot interference filter in FIG. 1.

In addition, the cutting step may be carried out as illustrated in FIGS. 9(a) and 9(b). Specifically, as illustrated in FIG. 9(a), the expanding tape 60 is attached onto the protective layer 460 (that is, the second main surface 110b side). Subsequently, in a state in which the expanding tape 60 is attached to the second main surface 110b side, irradiation of the laser light L is performed from the expanding tape 60 side, and the converging point of the laser light L is relatively moved along each of the lines 10 while the converging point of the laser light L is positioned within the wafer 110. That is, the laser light L is incident on the wafer 110 from the expanding tape 60 side through the expanding tape 60. Then, the modified region is formed within the wafer 110 along each of the lines 10 through the irradiation of the laser light L.

Subsequently, as illustrated in FIG. 9(b), crack is extended in the thickness direction of the wafer 110 from the modified region formed within the wafer 110 by expanding the expanding tape 60 attached to the second main surface 110b side, and the wafer 110 is cut into the plurality of substrates 11 along each of the lines 10. Then, the plurality of Fabry-Perot interference filters 1 in a state of being separated from each other on the expanding tape 60 are obtained.

According to such a cutting step, as illustrated in FIG. 9(a), for example, even if generated particles fall due to their own weights when irradiation of the laser light L is performed from above, the expanding tape 60 functions as a cover. Therefore, it is possible to prevent such particles from adhering to the second mirror layer 240 or the like.

In addition, in the cutting step, when the modified region is formed within the wafer 110 along each of the lines 10 through irradiation of the laser light L, crack may be extended in the thickness direction of the wafer 110 from the modified region and the wafer 110 may be cut into the plurality of substrates 11 along each of the lines 10. In this case, the plurality of Fabry-Perot interference filters 1 obtained through cutting can be separated from each other by expanding the expanding tape 60.

In addition, in the forming step, at least one of the first mirror layer 220, the sacrificial layer 230, and the second mirror layer 240 may be partially thinned along each of the lines 10 such that the surface of the polysilicon layer configuring the first mirror layer 220 instead of the second mirror layer 240 is exposed, and in the cutting step, the laser light L may be incident on the wafer 110 through the surface of the polysilicon layer included in the first mirror layer 220 instead of the second mirror layer 240.

Moreover, the layer of which the surface is exposed in the forming step need only be at least one layer configuring the first mirror layer 220 or the second mirror layer 240. Specifically, the layer of which the surface is exposed in the forming step is not limited to a polysilicon layer and may be a silicon nitride layer or a silicon oxide layer, for example. In that case as well, the first main surface 110a of the wafer 110 is protected by the layer of which the surface is exposed, and flatness of a surface, on which the laser light L is incident, is maintained. Therefore, scattering or the like of the laser light L is prevented so that the modified region can be more reliably formed within the wafer 110. When forming a smooth surface, in order to partially thin at least one of the first mirror layer 220, the sacrificial layer 230, and the second mirror layer 240 along each of the lines 10, it is more advantageous to carry out wet etching than dry etching.

In addition, in the cutting step, the wafer 110 may be cut into a plurality of substrates 11 along each of the lines 10 through blade dicing, laser ablation dicing, cutting by a water jet saw, ultrasound dicing, or the like. By means of these methods, the wafer 110 may be cut into a plurality of substrates 11 along each of the lines 10 by cutting the wafer 110 in half along each of the lines 10 from the first main surface 110a side, and then polishing the second main surface 110b of the wafer 110.

Figure 10:
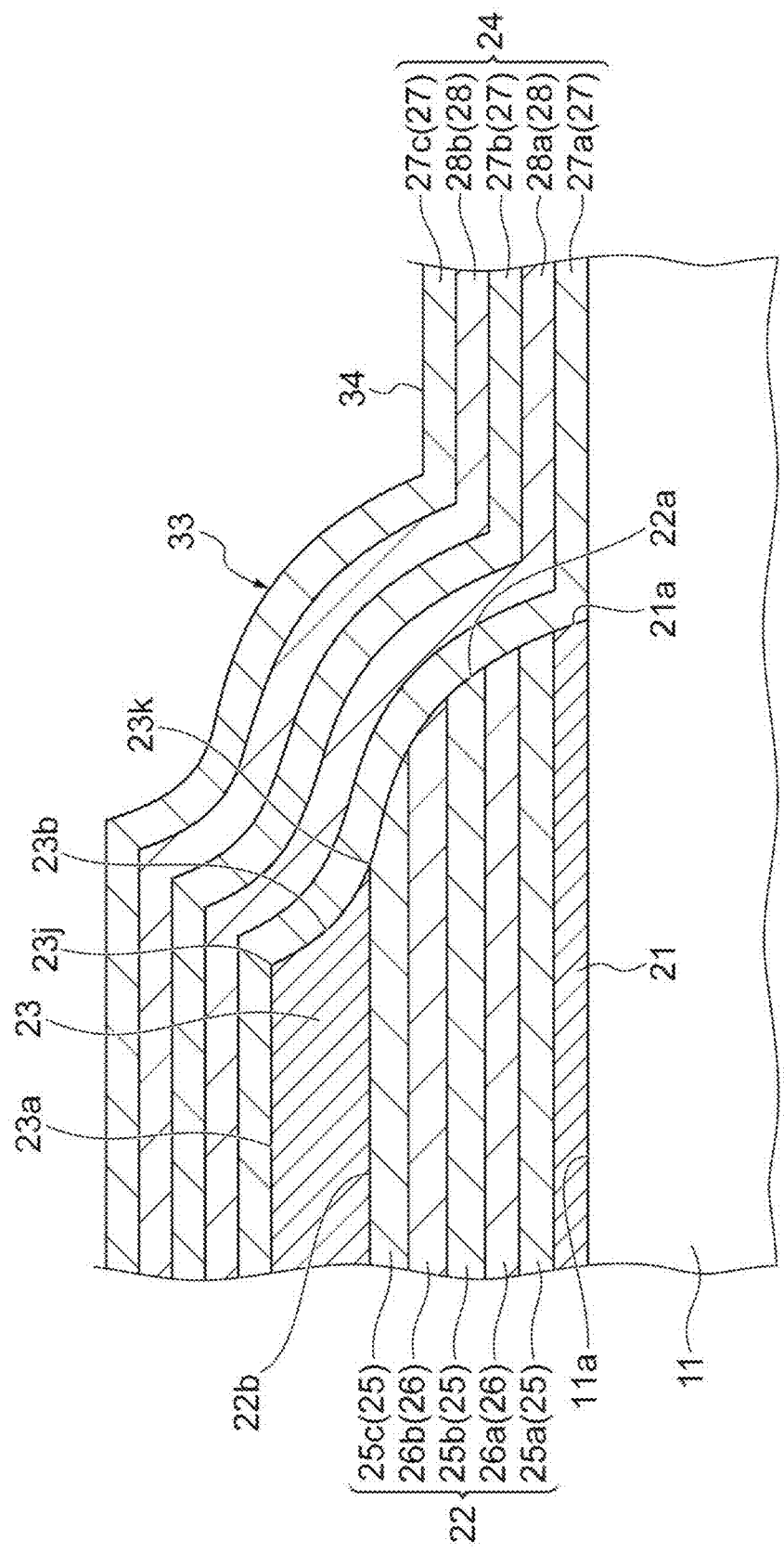
FIG. 10 is an enlarged cross-sectional view of an outer edge part in a modification example of the Fabry-Perot interference filter in FIG. 1.

In addition, in the forming step, the first thinned region 290 may be formed such that at least the side surface 23b of the intermediate layer 23 is curved (such that a continuously curved surface is formed). FIG. 10 is an enlarged cross-sectional view of an outer edge part of the Fabry-Perot interference filter 1 obtained when the first thinned region 290 is formed such that the side surface 23b of the intermediate layer 23, the side surface 22a of the first laminate 22, and the side surface 21a of the reflection prevention layer 21 are continuously curved.

The Fabry-Perot interference filter 1 illustrated in FIG. 10 will be described. The side surface 23b of the intermediate layer 23 is curved such that an edge portion 23k of the intermediate layer 23 on the substrate 11 side is positioned on an outer side in a direction parallel to the first surface 11a from an edge portion 23j of the intermediate layer 23 on a side opposite to the substrate 11. That is, in a case of being seen in a direction perpendicular to the first surface 11a, the edge portion 23k surrounds the edge portion 23j. More specifically, the side surface 23b is curved in a recessed shape on the gap S side in a cross section perpendicular to the first surface 11a. The side surface 23b is smoothly connected to the surface 22b or the side surface 22a of the first laminate 22. The side surface 23b is curved in a recessed shape on the gap S side so as to be away from the gap S in a direction parallel to the first surface 11a while being closer to the substrate 11 in a direction perpendicular to the first surface 11a. In other words, on the side surface 23b, the angle of the side surface 23b with respect to the first surface 11a decreases while being closer to the substrate 11 in a direction perpendicular to the first surface 11a.

The side surface 22a of the first laminate 22 and the side surface 21a of the reflection prevention layer 21 are positioned on an outer side in a direction parallel to the first surface 11a with respect to the center portion of the gap S from the side surface 23b of the intermediate layer 23. The side surface 22a of the first laminate 22 and the side surface 21a of the reflection prevention layer 21 are curved in a projected shape on a side opposite to the gap S so as to be away from the gap S in a direction parallel to the first surface 11a while being closer to the substrate 11 in a direction perpendicular to the first surface 11a. In other words, in the side surface 22a of the first laminate 22 and the side surface 21a of the reflection prevention layer 21, the angles of the side surface 22a of the first laminate 22 and the side surface 21a of the reflection prevention layer 21 with respect to the first surface 11a increase while being closer to the substrate 11 in a direction perpendicular to the first surface 11a.

Figure 11:
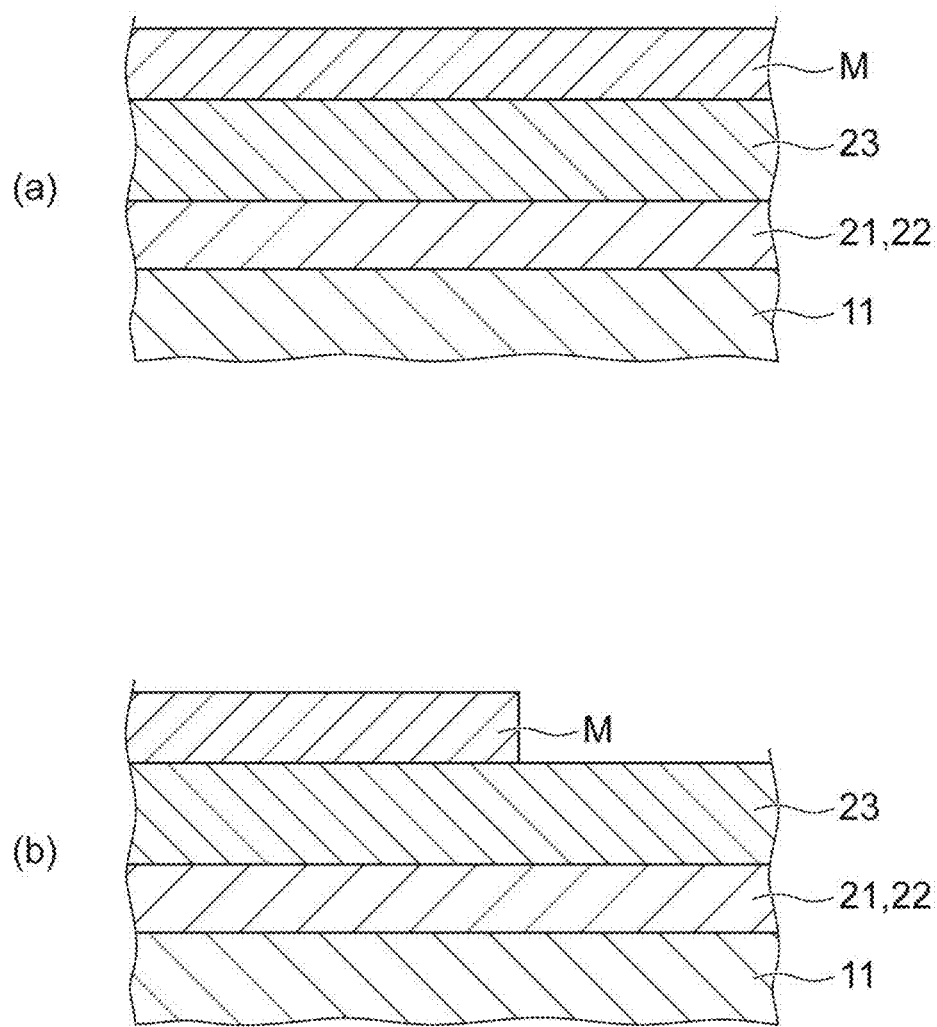
FIGS. 11(a) and 11(b) are views for describing an example of a step of manufacturing the Fabry-Perot interference filter in FIG. 10.
Figure 12:
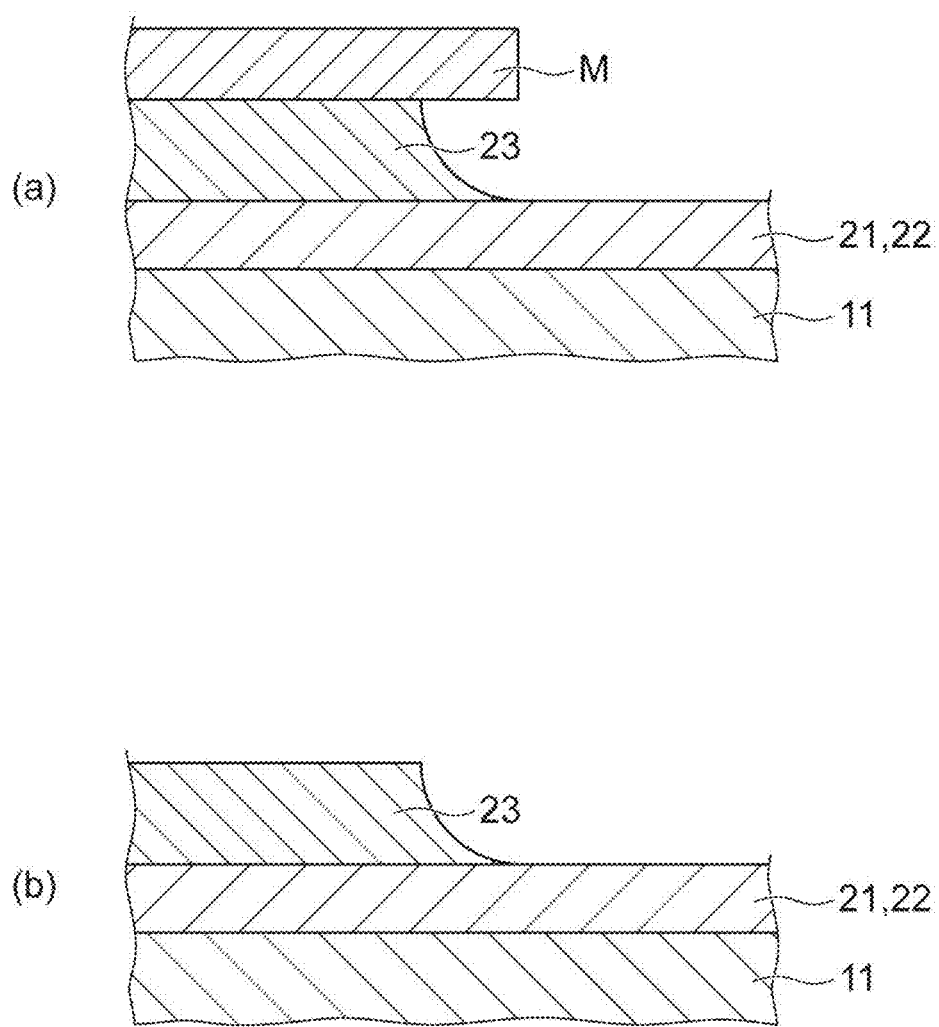
FIGS. 12(a) and 12(b) are views for describing an example of the step of manufacturing the Fabry-Perot interference filter in FIG. 10.

As described above, an example of a method for causing the side surface 23b of the intermediate layer 23 to be curved in a recessed shape will be described. First, as illustrated in FIG. 11(a), a resist layer M is formed on the intermediate layer 23. Subsequently, as illustrated in FIG. 11(b), the resist layer M is patterned, and a region to be removed in the intermediate layer 23 is exposed. Subsequently, as illustrated in FIG. 12(a), the intermediate layer 23 is subjected to etching (wet etching). At this time, since the part covered with the resist layer M in the intermediate layer 23 is removed, the side surface 23b of the intermediate layer 23 is curved in a recessed shape. The reflection prevention layer 21 and the first laminate 22 are formed in stages while repeating film-forming and etching, and etching of the intermediate layer 23 is carried out such that the side surface 23b of the intermediate layer 23 is continuously (smoothly) connected to the side surface 22a of the first laminate 22. Consequently, the side surface 23b of the intermediate layer 23, the side surface 22a of the first laminate 22, and the side surface 21a of the reflection prevention layer 21 have a continuously curved shape. Subsequently, as illustrated in FIG. 12(b), the resist layer M is removed from the intermediate layer 23.

Figure 13:
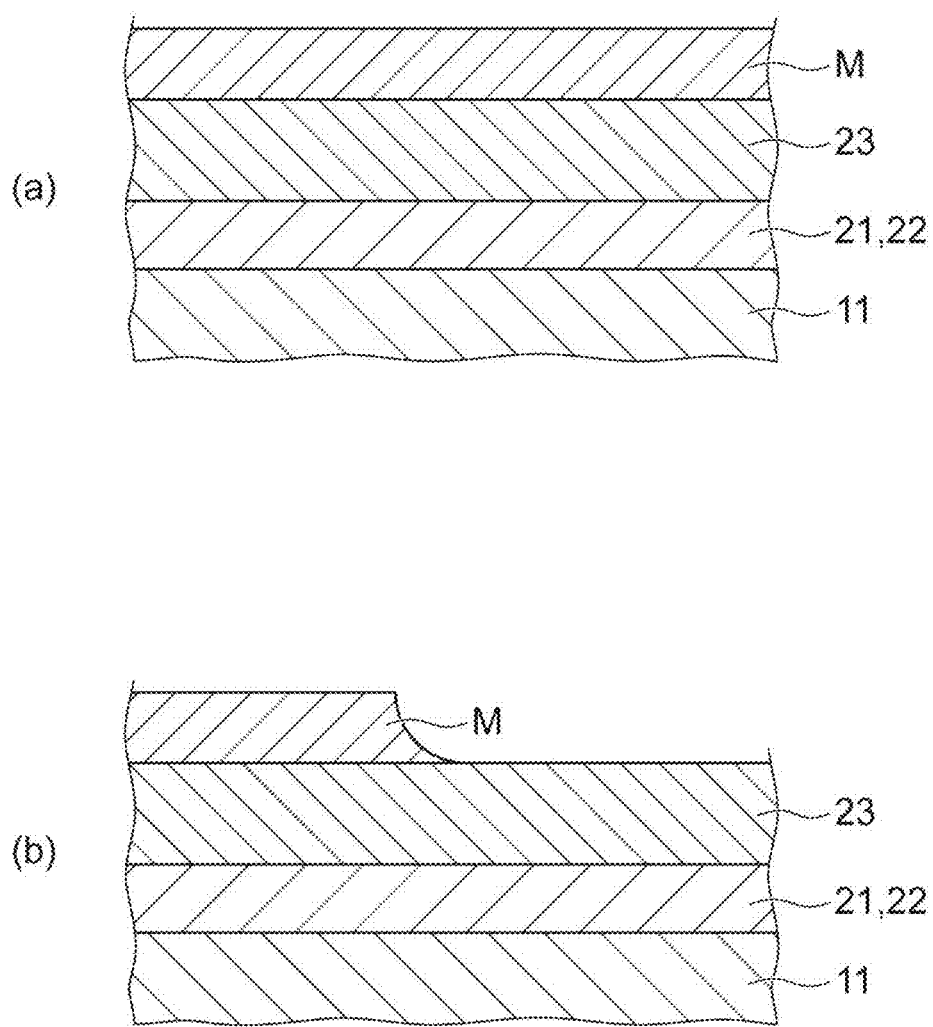
FIGS. 13(a) and 13(b) are views for describing another example of the step of manufacturing the Fabry-Perot interference filter in FIG. 10.
Figure 14:
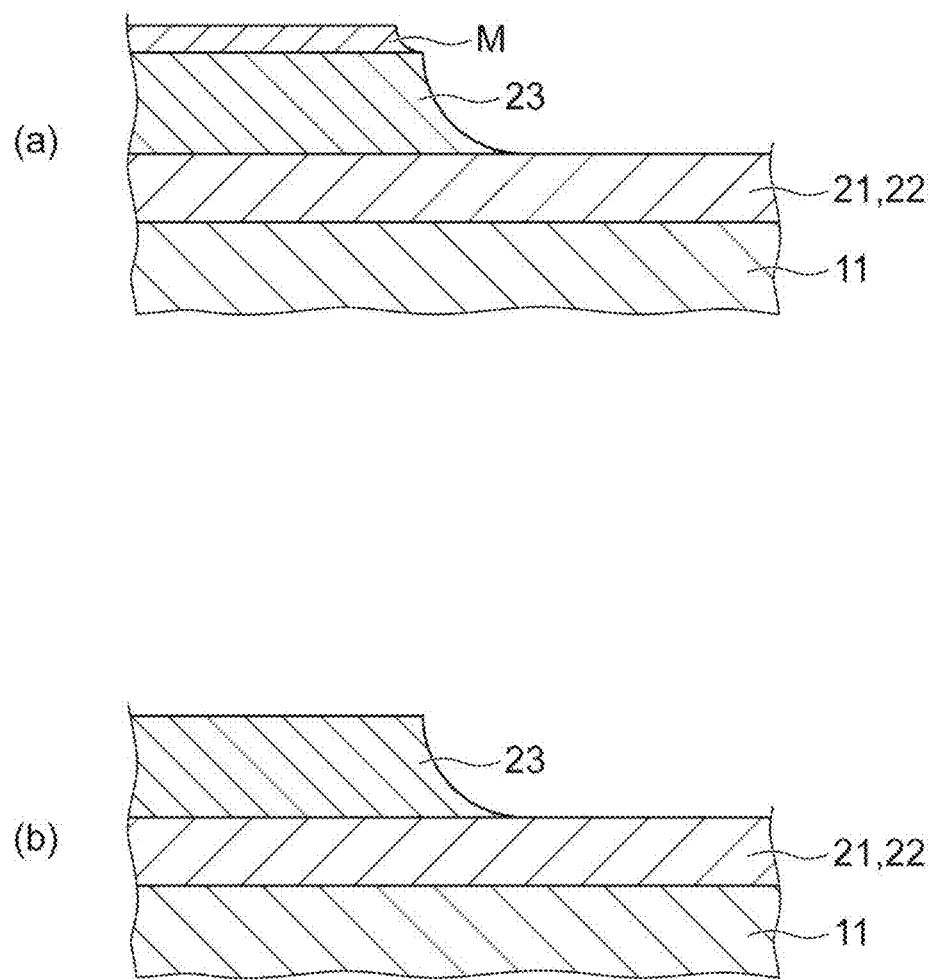
FIGS. 14(a) and 14(b) are views for describing another example of the step of manufacturing the Fabry-Perot interference filter in FIG. 10.

In addition, the side surface 23b of the intermediate layer 23 can also be curved in a recessed shape, as follows. First, as illustrated in FIG. 13(a), the resist layer M is formed on the intermediate layer 23. Subsequently, the resist layer M is subjected to exposure and development by using a 3D mask. Accordingly, as illustrated in FIG. 13(b), a region to be removed in the intermediate layer 23 is exposed, and a side surface of the resist layer M is curved in a recessed shape. Subsequently, as illustrated in FIG. 14(a), the intermediate layer 23 is subjected to dry etching. At this time, since the shape of the side surface of the resist layer M is copied onto the side surface 23b of the intermediate layer 23, the side surface 23b of the intermediate layer 23 is curved in a recessed shape. Subsequently, as illustrated in FIG. 14(b), the resist layer M is removed from the intermediate layer 23.

Figure 15:
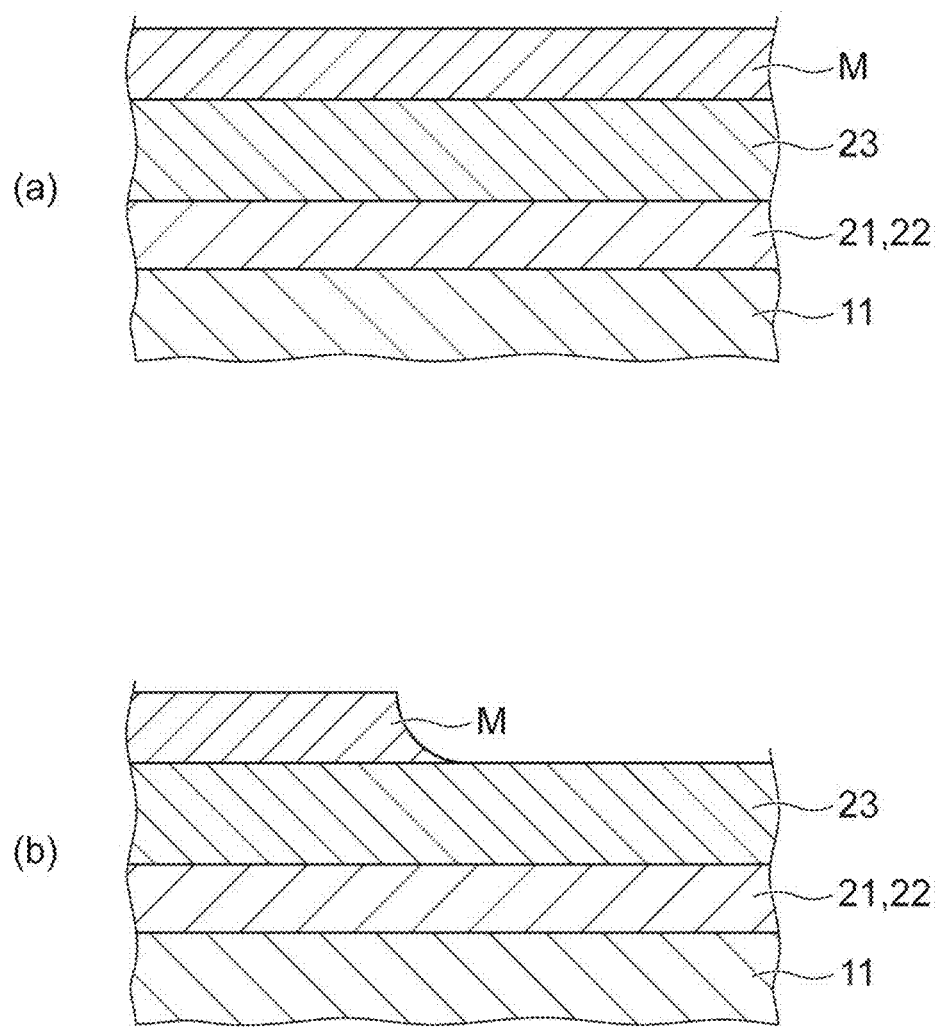
FIGS. 15(a) and 15(b) are views for describing another example of the step of manufacturing the Fabry-Perot interference filter in FIG. 10.
Figure 16:
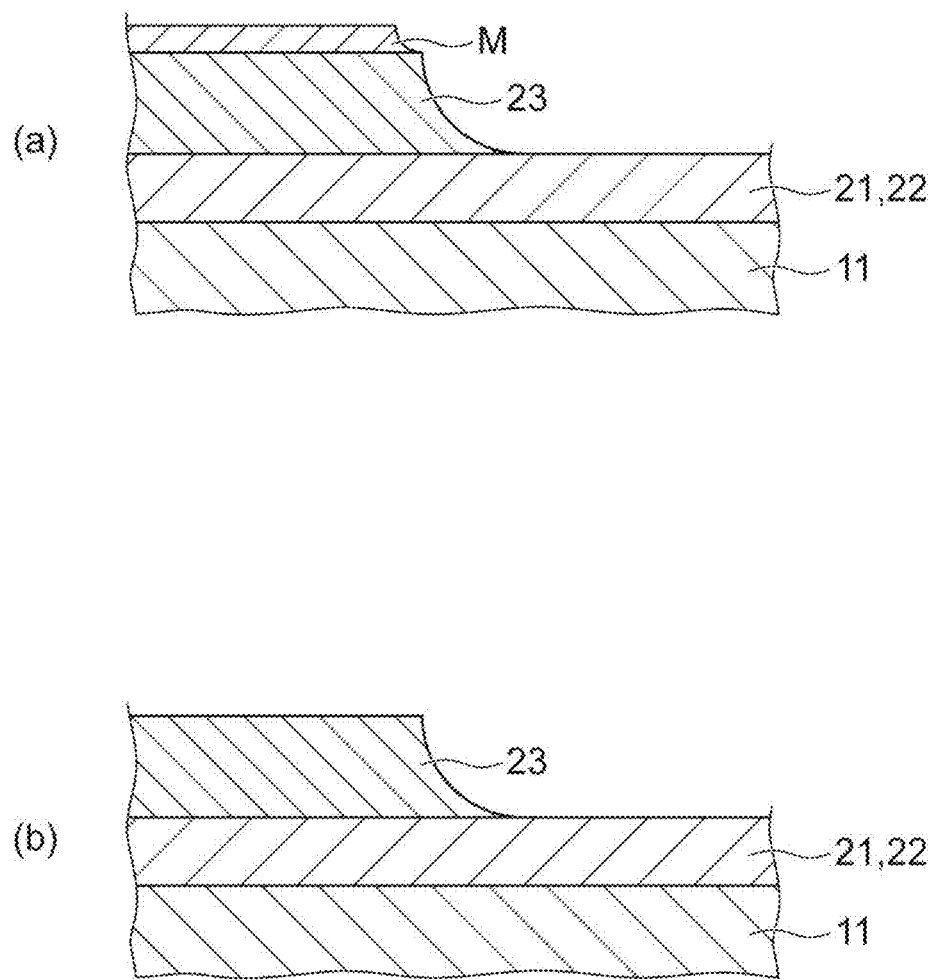
FIGS. 16(a) and 16(b) are views for describing another example of the step of manufacturing the Fabry-Perot interference filter in FIG. 10.

Moreover, the side surface 23b of the intermediate layer 23 can also be curved in a recessed shape, as follows. First, as illustrated in FIG. 15(a), the resist layer M is formed on the intermediate layer 23. Subsequently, the resist layer M is subjected to photolithography. Accordingly, as illustrated in FIG. 15(b), a region to be removed in the intermediate layer 23 is exposed, and the side surface of the resist layer M is curved in a recessed shape. The side surface of the resist layer M can be curved in a recessed shape by adjusting conditions (for example, the material and the like) for the resist layer M and conditions (for example, an exposure condition, a development condition, and a baking condition) for photolithography. Subsequently, as illustrated in FIG. 16(a), the intermediate layer 23 is subjected to dry etching. At this time, since the shape of the side surface of the resist layer M is copied onto the side surface 23b of the intermediate layer 23, the side surface 23b of the intermediate layer 23 is curved in a recessed shape. Subsequently, as illustrated in FIG. 16(b), the resist layer M is removed from the intermediate layer 23.

In the Fabry-Perot interference filter 1 illustrated in FIG. 10, the covering portion 33 of the second laminate 24 covers the side surface 23b of the intermediate layer 23. Consequently, it is possible to prevent noise from being increased in light output from the Fabry-Perot interference filter 1 due to incident light from the side surface 23b of the intermediate layer 23. Therefore, characteristics of the Fabry-Perot interference filter 1 can be prevented from deteriorating. Incidentally, in this Fabry-Perot interference filter 1, since the second laminate 24 covers the side surface 23b of the intermediate layer 23, when the second mirror portion 32 moves to the first mirror portion 31 side, a force acts on a region covering the side surface 23b of the intermediate layer 23 in the second laminate 24, so as to be directed to the second mirror portion 32 side. Therefore, stress is likely to be concentrated in a corner portion of the side surface 23b of the intermediate layer 23 on the second laminate 24 side. Here, in the Fabry-Perot interference filter 1 illustrated in FIG. 10, the side surface 23b of the intermediate layer 23 is curved such that the edge portion 23k of the intermediate layer 23 on the substrate 11 side is positioned on an outer side in a direction parallel to the first surface 11a from the edge portion 23j of the intermediate layer 23 on a side opposite to the substrate 11. Consequently, stress can be dispersed in the corner portion of the side surface 23b of the intermediate layer 23 on the second laminate 24 side. Therefore, it is possible to prevent damage such as a crack from being caused in the corner portion. As described above, according to the Fabry-Perot interference filter 1 illustrated in FIG. 10, high reliability can be achieved.

In addition, in the Fabry-Perot interference filter 1 illustrated in FIG. 10, compared to a case in which the side surface 23b of the intermediate layer 23 is not curved, a contact area between the side surface 23b of the intermediate layer 23 and the second laminate 24 is widened. Consequently, the second laminate 24 can be firmly fixed to the side surface 23b of the intermediate layer 23. In addition, the side surface 23b of the intermediate layer 23 is curved so as to be away from the gap S in a direction parallel to the first surface 11a while being closer to the substrate 11 in a direction perpendicular to the first surface 11a. Therefore, in the manufacturing step, the thickness (coverage) of the covering portion 33 of the second laminate 24 covering the side surface 23b of the intermediate layer 23 can be favorably maintained.

In addition, in the Fabry-Perot interference filter 1 illustrated in FIG. 10, the side surface 23b of the intermediate layer 23 is curved in a recessed shape on the gap S side such that the edge portion 23k of the intermediate layer 23 on the substrate 11 side is positioned on an outer side in a direction parallel to the first surface 11a from the edge portion 23j of the intermediate layer 23 on a side opposite to the substrate 11. Consequently, the angle of the side surface 23b of the intermediate layer 23 with respect to the first surface 11a decreases in a part close to the substrate 11 on the side surface 23b of the intermediate layer 23, while being closer to the substrate 11 in a direction perpendicular to the first surface 11a. Accordingly, the second laminate 24 can be prevented from peeling from a part close to the substrate 11 on the side surface 23b of the intermediate layer 23.

In addition, in the Fabry-Perot interference filter 1 illustrated in FIG. 10, the side surface 23b of the intermediate layer 23 is curved so as to be away from the gap S in a direction parallel to the first surface 11a while being closer to the substrate 11 in a direction perpendicular to the first surface 11a. Consequently, the side surface 23b of the intermediate layer 23 in its entirety is separated from the gap S in a direction parallel to the first surface 11a while being closer to the substrate 11 in a direction perpendicular to the first surface 11a. Accordingly, stress can be further dispersed in the corner portion of the side surface 23b of the intermediate layer 23 on the second laminate 24 side.

In addition, in the Fabry-Perot interference filter 1 illustrated in FIG. 10, the side surface 22a of the first laminate 22 is positioned on an outer side in a direction parallel to the first surface 11a with respect to the center portion of the gap S from the side surface 23b of the intermediate layer 23, and the covering portion 33 of the second laminate 24 covers the side surface 22a of the first laminate 22. Consequently, the covering portion 33 of the second laminate 24 covers the side surface 22a of the first laminate 22 beyond the side surface 23b of the intermediate layer 23 and is fixed to the side surface 22a of the first laminate 22. Thus, the second laminate 24 can be prevented from peeling from a part close to the substrate 11 on the side surface 23b of the intermediate layer 23.

In addition, in the Fabry-Perot interference filter 1 illustrated in FIG. 10, in a case of being seen in a direction perpendicular to the first surface 11a, the substrate 11 has the outer edge portion 11c positioned on an outer side from the outer edge of the first laminate 22, and the second laminate 24 covers the outer edge portion 11c. Consequently, the second laminate 24 covers the outer edge portion 11c of the substrate 11 beyond the outer edge of the first laminate 22, so that the first laminate 22 is fixed to the substrate 11 side. Thus, the first laminate 22 can be prevented from peeling from the substrate 11 side.

In addition, in the Fabry-Perot interference filter 1 illustrated in FIG. 10, the side surface 22a of the first laminate 22 is curved so as to be away from the gap S in a direction parallel to the first surface 11a while being closer to the substrate 11 in a direction perpendicular to the first surface 11a. Consequently, the covering portion 33 of the second laminate 24 is more firmly fixed to the side surface 22a of the first laminate 22. Thus, the second laminate 24 can be prevented from peeling from a part close to the substrate 11 on the side surface 23b of the intermediate layer 23.

REFERENCE SIGNS LIST

1 Fabry-Perot interference filter, 10: Line, 11: Substrate, 31: First mirror portion, 32: Second mirror portion, 50: Portion expected to be removed, 60: Expanding tape, 110: Wafer, 110a: First main surface, 110b: Second main surface, 220: First mirror layer, 230: Sacrificial layer, 230a: Side surface, 240: Second mirror layer, 290: First thinned region, 400: Stress adjustment layer, 470: Second thinned region, L: Laser light.

The invention claimed is:

1. A method of manufacturing a Fabry-Perot interference filter comprising:
a forming step of forming a first mirror layer having a plurality of first mirror portions each of which is expected to function as a fixed mirror, a sacrificial layer having a plurality of portions expected to be removed, and a second mirror layer having a plurality of second mirror portions each of which is expected to function as a movable mirror, on a first main surface of a wafer which includes parts corresponding to a plurality of two-dimensionally arranged substrates and is expected to be cut into the plurality of substrates along each of a plurality of lines, such that one first mirror portion, one portion expected to be removed, and one second mirror portion are disposed in this order from one substrate side;
a removing step of simultaneously removing the plurality of two-dimensionally arranged portions expected to be removed from the sacrificial layer through etching after the forming step; and
a cutting step of cutting the wafer into the plurality of substrates along each of the plurality of lines after the removing step,
wherein in the forming step, a first thinned region, in which at least one of the first mirror layer, the sacrificial layer, and the second mirror layer is partially thinned along each of the plurality of lines, is formed, and
wherein in the forming step, a stress adjustment layer is formed on a second main surface of the wafer, and a second thinned region in which the stress adjustment layer is partially thinned along each of the plurality of lines, is formed.

2. The method of manufacturing a Fabry-Perot interference filter according to claim 1,
wherein in the forming step, the first thinned region is formed by thinning a part along each of the plurality of lines in at least the sacrificial layer and the second mirror layer.

3. The method of manufacturing a Fabry-Perot interference filter according to claim 1,
wherein in the cutting step, the wafer is cut into the plurality of substrates along each of the plurality of lines by forming a modified region within the wafer along each of the plurality of lines through irradiation of laser light and extending a crack in a thickness direction of the wafer from the modified region.

4. The method of manufacturing a Fabry-Perot interference filter according to claim 3,
wherein in the cutting step, the crack is extended in the thickness direction of the wafer from the modified region by expanding an expanding tape attached to the second main surface side of the wafer.

5. The method of manufacturing a Fabry-Perot interference filter according to claim 4,
wherein in the cutting step, in a state in which the expanding tape is attached to the second main surface side, the laser light is incident on the wafer from a side opposite to the expanding tape.

6. The method of manufacturing a Fabry-Perot interference filter according to claim 4,
wherein in the cutting step, in a state in which the expanding tape is attached to the second main surface side, the laser light is incident on the wafer through the expanding tape from the expanding tape side.

7. A method of manufacturing a Fabry-Perot interference filter comprising:
a forming step of forming a first mirror layer having a plurality of first mirror portions each of which is expected to function as a fixed mirror, a sacrificial layer having a plurality of portions expected to be removed, and a second mirror layer having a plurality of second mirror portions each of which is expected to function as a movable mirror, on a first main surface of a wafer which includes parts corresponding to a plurality of two-dimensionally arranged substrates and is expected to be cut into the plurality of substrates along each of a plurality of lines, such that one first mirror portion, one portion expected to be removed, and one second mirror portion are disposed in this order from one substrate side;
a removing step of simultaneously removing the plurality of two-dimensionally arranged portions expected to be removed from the sacrificial layer through etching after the forming step; and
a cutting step of cutting the wafer into the plurality of substrates along each of the plurality of lines after the removing step,
wherein in the forming step, a first thinned region, in which at least one of the first mirror layer, the sacrificial layer, and the second mirror layer is partially thinned along each of the plurality of lines, is formed, and
wherein in the forming step, after a part along each of the plurality of lines in the sacrificial layer formed on the first mirror layer is thinned, side surfaces of the sacrificial layer facing each other along each of the plurality of lines are covered with the second mirror layer by forming the second mirror layer on the sacrificial layer.

8. The method of manufacturing a Fabry-Perot interference filter according to claim 7,
wherein in the forming step, the first thinned region is formed by thinning a part along each of the plurality of lines in at least the sacrificial layer and the second mirror layer.

9. The method of manufacturing a Fabry-Perot interference filter according to claim 7,
wherein in the cutting step, the wafer is cut into the plurality of substrates along each of the plurality of lines by forming a modified region within the wafer along each of the plurality of lines through irradiation of laser light and extending a crack in a thickness direction of the wafer from the modified region.

10. The method of manufacturing a Fabry-Perot interference filter according to claim 9,
wherein in the cutting step, the crack is extended in the thickness direction of the wafer from the modified region by expanding an expanding tape attached to the second main surface side of the wafer.

11. The method of manufacturing a Fabry-Perot interference filter according to claim 10,
wherein in the cutting step, in a state in which the expanding tape is attached to the second main surface side, the laser light is incident on the wafer from a side opposite to the expanding tape.

12. The method of manufacturing a Fabry-Perot interference filter according to claim 10,
wherein in the cutting step, in a state in which the expanding tape is attached to the second main surface side, the laser light is incident on the wafer through the expanding tape from the expanding tape side.

\* \* \* \* \*